(12) United States Patent
Tokuhisa et al.

(10) Patent No.: US 7,397,598 B2
(45) Date of Patent: Jul. 8, 2008

(54) LIGHT SOURCE UNIT AND LIGHT IRRADIATION UNIT

(75) Inventors: Akira Tokuhisa, Shinagawa-ku (JP);
Hiroshi Kitano, Nishinomiya (JP);
Hitoshi Kawai, Kawasaki (JP)

(73) Assignee: Nikon Corporation, Tokyo (JP)

( * ) Notice: Subject to any disclaimer, the term of this patent is extended or adjusted under 35 U.S.C. 154(b) by 509 days.

(21) Appl. No.: 10/921,932

(22) Filed: Aug. 20, 2004

(65) Prior Publication Data
US 2006/0039423 A1 Feb. 23, 2006

(51) Int. Cl.
*G02F 1/35* (2006.01)
*G02F 2/02* (2006.01)
(52) U.S. Cl. .................. 359/326; 359/328; 359/330
(58) Field of Classification Search .......... 359/326–332
See application file for complete search history.

(56) References Cited

U.S. PATENT DOCUMENTS

| | | | | |
|---|---|---|---|---|
| 5,574,810 A | * | 11/1996 | Byron et al. | 385/37 |
| 5,838,709 A | | 11/1998 | Owa | |
| 5,940,418 A | * | 8/1999 | Shields | 372/22 |
| 6,256,327 B1 | * | 7/2001 | Goldberg | 372/22 |
| 6,304,585 B1 | * | 10/2001 | Sanders et al. | 372/22 |
| 6,324,203 B1 | | 11/2001 | Owa | |
| 6,590,698 B1 | | 7/2003 | Ohtsuki et al. | |
| 2002/0036820 A1 | * | 3/2002 | Merriam et al. | 359/330 |
| 2002/0054613 A1 | * | 5/2002 | Kang | 372/6 |
| 2004/0095982 A1 | * | 5/2004 | Momiuchi et al. | 372/92 |
| 2004/0114643 A1 | * | 6/2004 | Payne et al. | 372/6 |
| 2005/0169326 A1 | * | 8/2005 | Jacob et al. | 372/22 |

FOREIGN PATENT DOCUMENTS

| | | |
|---|---|---|
| JP | 2002-197797 | 7/2002 |
| JP | 2004-86193 | 3/2004 |

\* cited by examiner

*Primary Examiner*—M. R. Connelly-Cushwa
(74) *Attorney, Agent, or Firm*—Oblon, Spivak, McClelland, Maier & Neustadt, P.C.

(57) ABSTRACT

In nonlinear optical crystal 183D, each step of wavelength conversion can be performed using another fundamental wave that is output from light output unit $161_2$, without using the fundamental wave whose output level has been attenuated after going through wavelength conversion for several steps (wavelength conversion in nonlinear optical crystals 183A to 183C). Therefore, the wavelength conversion efficiency improves and the peak power of optical amplifiers $161_1$ and $161_2$ can be suppressed, which allows the wavelength of lights that are output from optical amplifiers $161_1$ and $161_2$ to be further narrowed.

20 Claims, 18 Drawing Sheets

LIGHT SOURCE UNIT AND LIGHT IRRADIATION UNIT

BACKGROUND OF THE INVENTION

1. Field of the Invention

The present invention relates to light source units and light irradiation units, more particularly to a light source unit that comprises a wavelength converter, which converts light having a single wavelength emitted from a laser light source into light having a different wavelength, and a light irradiation unit that comprises the light source unit.

2. Description of the Related Art

Conventionally, light irradiation units have been used for fine structure inspection of objects, fine processing of objects, and for vision correction treatment. For example, in a lithographic process for manufacturing semiconductor devices or the like, in order to transfer a pattern formed on a mask or a reticle (hereinafter generally referred to as a "reticle") onto a substrate such as a wafer on which a resist or the like is coated or a glass plate (hereinafter appropriately referred to as a "substrate" or a "wafer") via a projection optical system, exposure apparatuses are used, which is a type of a light irradiation unit. As such an exposure apparatus, a static exposure type projection exposure apparatus that employs a step-and-repeat method, or a scanning exposure type projection exposure apparatus that employs a step-and-scan method is mainly used. In addition, for vision correction, a laser treatment system, which is also a type of light irradiation unit, is used to perform ablation of a corneal layer (PRK: Photorefractive Keratectomy) or ablation of inner cornea (LASIK: Laser Intrastromal Karatomileusis) for treatment of nearsightedness, astigmatism, or the like.

Many light sources that generate light having a short wavelength have been developed for such light irradiation units. The direction of development of such light sources with short wavelengths can be mainly divided into the following two groups. One is the development of an excimer laser light source whose laser oscillation wavelength itself is short, and the other one is the development of a short wavelength light source that makes use of harmonic generation of infrared or visible light laser.

Of such development, along the direction of the former group, a light source unit that uses a KrF excimer laser (wavelength: 248 nm) has been developed, and at present, a light source unit that uses an ArF excimer laser (wavelength: 193 nm) or the like is being developed as a light source having shorter wavelength. However, such excimer lasers have their disadvantages as light source units, such as their large size, and their complicated maintenance operation and high running cost due to hazardous fluorine gas used.

Therefore, a method of shortening the wavelength along the direction of the latter group is gathering attention, which is a method of converting long wavelength light (such as infrared light or visible light) into ultraviolet light with a shorter wavelength by using a nonlinear optical effect of a nonlinear optical crystal. As a light source that uses such a method, one disclosed in International Publication WO99/46835 pamphlet and the corresponding U.S. Pat. No. 6,590,698, (hereinafter simply referred to as a "conventional example"), for example, are available.

In the wavelength shortening method using nonlinear optical crystals as in the method described above, the generating efficiency of short wavelength light depends on the generating efficiency of the nonlinear optical effect of the nonlinear optical crystal. The higher the brightness (includes the meaning of a "peak power") of incident light whose wavelength is to be converted is, the higher the generating efficiency of its nonlinear optical efficiency becomes. Therefore, in order to obtain ultraviolet light with good efficiency, high brightness infrared light or visible light has to be incident on the nonlinear optical crystal. So, in the above conventional example, infrared light or visible light of a single wavelength generated by a semiconductor laser or the like is amplified by an optical fiber amplifier that has an amplifying optical fiber in which a rare earth element such as erbium (Er) is doped, and the light is made to be incident on the nonlinear optical crystal. In such an optical fiber amplifier, an optical amplifying function is given to the amplifying optical fiber by supplying exciting light to the amplifying optical fiber to excite the doped rare earth element and to form population inversion regarding the energy level of outer shell electrons of the rare earth element.

When the light having a long wavelength (infrared light, visible light) is converted into ultraviolet light having a shorter wavelength as in the art of the conventional example described above, wavelength conversion is performed by generating a secondary harmonic or a sum-frequency of the incident light, using the nonlinear optical effect of the nonlinear optical crystal. However, in such a case, the following disadvantages occurred.

(1) When obtaining an m-fold wave (m: natural number) of a fundamental wave, in the case an (m-1)-fold wave is already obtained, a sum-frequency generation of the (m-1)-fold wave and the fundamental wave is performed in order to obtain light having a desired wavelength. Normally, as the fundamental wave used for generating the sum-frequency, a fundamental wave is used that has passed through the nonlinear optical crystal in the previous step without being converted into a harmonic. However, the output level of the fundamental wave having passed through the nonlinear optical crystal in the previous step and reached a nonlinear optical crystal in the final step has attenuated significantly, and in such a case, sufficient wavelength conversion efficiency cannot be obtained.

(2) The wavelength that can be converted is limited to a wavelength of the m-fold wave of the fundamental wave, depending on the wavelength of the fundamental wave used for wavelength conversion.

SUMMARY OF THE INVENTION

The present invention has been made under such circumstances, and its first object is to provide a light source unit that can improve wavelength conversion efficiency.

Further, the second object of the present invention is to provide a light irradiation unit that can irradiate light whose wavelength is efficiently converted onto an object (an irradiation object).

According to the first aspect of this invention, there is provided a first light source unit that generates light having a predetermined wavelength, the unit comprising: a plurality of light output units that output lights having wavelengths different from the predetermined wavelength; and a wavelength converter that generates light having the predetermined wavelength by wavelength conversion in a plurality of steps which include wavelength conversion using two lights as incident lights whose fundamental waves are severally output from different light output units of the plurality of light output units.

With this unit, in the wavelength converter that converts light having a wavelength different from the predetermined wavelength into light of the predetermined wavelength step by step, at least one step of the wavelength conversion is executed where the incident light is two lights whose fundamental waves are lights severally output from different light output units. That is, in the first light source unit of the present invention, instead of performing wavelength conversion in all the steps by light whose output level has been attenuated after going through wavelength conversion for several steps using light output from one light output unit as a sole fundamental wave, at least one step of wavelength conversion can be performed using light having lights output from other light output units as the fundamental wave, so that the wavelength conversion efficiency can be improved.

Further, according to the first light source unit of the present invention, because the fundamental wave obtained from other light output units can be used as the fundamental wave in the wavelength conversion from the second step onward, the output level of the fundamental wave used in the wavelength conversion of the first step does not have to be kept at a high level for the wavelength conversion in the second step and after. Accordingly, the first light source unit of the present invention can suppress the peak power of the output from the light output unit that outputs the fundamental wave used in the wavelength conversion in the first step and the light output unit that outputs the fundamental wave used in the wavelength conversion in another step. When the peak power is suppressed, the spectrum of light output from the light output unit can be further narrowbanded.

In this case, the plurality of the light output units can include a plurality of units that output light of the same wavelength.

In the first light source unit of the present invention, at least one unit of the plurality of light output units can be a first unit that outputs light of a first wavelength, and at least one unit of the plurality of light output units can be a second unit that outputs light of a second wavelength different from light of the first wavelength.

With this unit, because light having a wavelength other than the m-fold wave of a single wavelength can be generated using two lights having different wavelengths as incident lights, the selection range of the wavelength of the output light can be widened.

In this case, wavelength conversion of the wavelength converter can include wavelength conversion in which the m-fold wave (m: natural number) of the light having the first wavelength output from the first unit and the n-fold wave (n: natural number) of the light having the second wavelength output from the second unit enter the converter to generate a sum-frequency of the m-fold wave and the n-fold wave.

In this case, the wavelength conversion that generates the sum-frequency can be a wavelength conversion, which generates a sum-frequency of the fundamental wave of light having the first wavelength output from the first unit and any one of a harmonic, a sum-frequency, and a difference frequency of light having the second wavelength output from the second unit. Alternatively, the wavelength conversion that generates the sum-frequency can be a wavelength conversion, which generates a sum-frequency of the fundamental wave of light having the second wavelength output from the second unit and any one of a harmonic, a sum-frequency, and a difference frequency of light having the first wavelength output from the first unit. Furthermore, in the case where one of the first unit and the second unit is in plurals, and the wavelength conversion of the wavelength converter can further include wavelength conversion that generates a sum-frequency of the generated sum-frequency and light output from the other one unit, which is not used for generating the sum-frequency.

In the first light source unit of the present invention, the first unit can be an ytterbium doped optical fiber amplifier, and the second unit can be an erbium doped optical fiber amplifier.

In the first light source unit of the present invention, the first unit can be an ytterbium doped optical fiber amplifier, the second unit can be at least one of a thulium doped optical fiber amplifier and a holmium doped optical fiber amplifier, and the wavelength converter can generate light having a wavelength near 193 nm, which is approximately the same wavelength as the oscillation frequency of an ArF excimer laser.

Further, in the first light source unit of the present invention, at least one unit of the plurality of light output units can be an optical fiber amplifier.

It is a matter of course that the light output unit is not limited to the optical fiber amplifier, and various amplifiers such as an induced Raman scattering amplifier and an induced Brillouin scattering amplifier can be applied. Further, a light source such as a laser light source (for example, an Nd:YAG laser light source) can be used as the light output unit, and such light sources can also be used in combination.

Furthermore, in the first light source unit of the present invention, at least one unit of the plurality of light output units can be an erbium doped optical fiber amplifier. The wavelength bandwidth of light that can be amplified by the erbium doped optical amplifier is 1530 nm or more and 1600 nm or less.

In the first light source unit of the present invention, at least one unit of the plurality of light output units can be an ytterbium doped optical fiber amplifier. The wavelength bandwidth of light that can be amplified by the ytterbium doped optical amplifier is 1030 nm or more and 1120 nm or less.

In this case, the wavelength of light input to the ytterbium doped optical fiber amplifier can be longer than 1060 nm. With such an arrangement, since the ytterbium doped optical fiber amplifier operates similar to a four-level system laser, high output can be obtained.

According to the unit, in the wavelength converter, wavelength conversion can be performed where the m-fold wave of a fundamental wave having the wavelength of 1030 nm or more and 1120 nm or less and the n-fold wave of a fundamental wave having the wavelength of 1530 nm or more and 1600 nm or less are used as incident lights, which widens the selection range of the wavelength of the output light.

In the first light source unit of the present invention, the wavelength converter can generate light having a wavelength near 248 nm, which is approximately the same wavelength as the oscillation wavelength of a KrF excimer laser.

With this unit, by using the first light source unit of the present invention instead of the KrF excimer laser light source whose maintenance and the like are difficult, light having a wavelength near 248 nm can be easily obtained.

In the first light source unit of the present invention, the wavelength converter can generate light having a wavelength near 193 nm, which is approximately the same wavelength as the oscillation wavelength of an ArF excimer laser.

With this configuration, by using the first light source unit of the present invention instead of the ArF excimer laser light source whose maintenance and the like are difficult, light having a wavelength near 193 nm can be easily obtained.

In the first light source unit of the present invention, the wavelength converter can generate light having a wavelength near 157 nm, which is approximately the same wavelength as the oscillation wavelength of an $F_2$ laser.

In the first light source unit of the present invention, the predetermined wavelength can be 90 nm and over up until 800 nm.

According to the second aspect of this invention, there is provided a second light source unit that generates light having a predetermined wavelength, the unit comprising: an ytterbium doped optical fiber amplifier that amplifies light having a wavelength near 1099 nm and outputs the amplified light as a fundamental wave; and a wavelength converter that converts the fundamental wave into a sevenfold wave of the fundamental wave to generate light having a wavelength near 157 nm, which is approximately the same wavelength as the oscillation wavelength of an $F_2$ laser.

According to the third aspect of this invention, there is provided a third light source unit that generates light having a predetermined wavelength, the unit comprising: an ytterbium doped optical fiber amplifier that amplifies light having a wavelength near 1095 nm and outputs the amplified light as a fundamental wave; and a wavelength converter that converts the fundamental wave into a triple wave of the fundamental wave to generate light having a wavelength near 365 nm, which is approximately the same wavelength as the wavelength of i-line.

According to the fourth aspect of this invention, there is provided a fourth light source unit that generates light having a predetermined wavelength, the unit comprising: at least one light output unit that outputs light having a wavelength near 1547 nm; and a wavelength converter using a $CsB_3O_5$ crystal as a nonlinear optical element that generates light having a wavelength near 221 nm, which is a sum-frequency of a fundamental wave and a sixfold wave of the fundamental wave.

In the first, second, third, and fourth light source unit of the present invention, the wavelength converter can perform wavelength conversion using a plurality of nonlinear optical elements. In this case, a nonlinear optical element of the plurality of nonlinear optical elements can be an $NH_4H_2PO_4$ crystal.

In the first, second, third and fourth light source units of the present invention, at least one nonlinear optical element of the plurality of nonlinear optical elements can be a quasi-phase-matching crystal. In this case, at least one of a $KTiOPO_4$ crystal and an $LiNbO_3$ crystal can be used as the quasi-phase-matching crystal, and a $BaMgF_4$ crystal can be used as the quasi-phase-matching crystal. In this case, the $BaMgF_4$ crystal can generate a sum-frequency of the fundamental wave and an m-fold wave (m: natural number) of the fundamental wave. With such an arrangement, the polarization inversion period of the quasi-phase-matching crystal can be extended as long as possible, which makes it easier to manufacture quasi-phase-matching crystals.

In the first, second, third, and fourth light source unit of the present invention, in between at least some units of the each light output unit and the wavelength converter, a delay unit can be inserted that delays light propagation input from the units to the wavelength converter by a predetermined period of time.

According to the fifth aspect of this invention, there is provided a light irradiation unit that irradiates light on an irradiation object, comprising: the first, second, third and fourth light source unit of the present invention; and an irradiation optical system that emits light emitted from the light source unit toward the irradiation object.

With this unit, because light output from the first, second, third, and fourth light source unit of the present invention is irradiated on the irradiation object via the irradiation optical system, light whose wavelength has been efficiently converted can be irradiated on the object (irradiation object).

In this case, the irradiation object can be a photosensitive object. That is, the light irradiation unit of the present invention can be an exposure apparatus.

DETAILED DESCRIPTION OF THE PREFERRED EMBODIMENTS

First Embodiment

A first embodiment of the present invention will be described below, referring to FIGS. 1 to 9.

Figure 1:
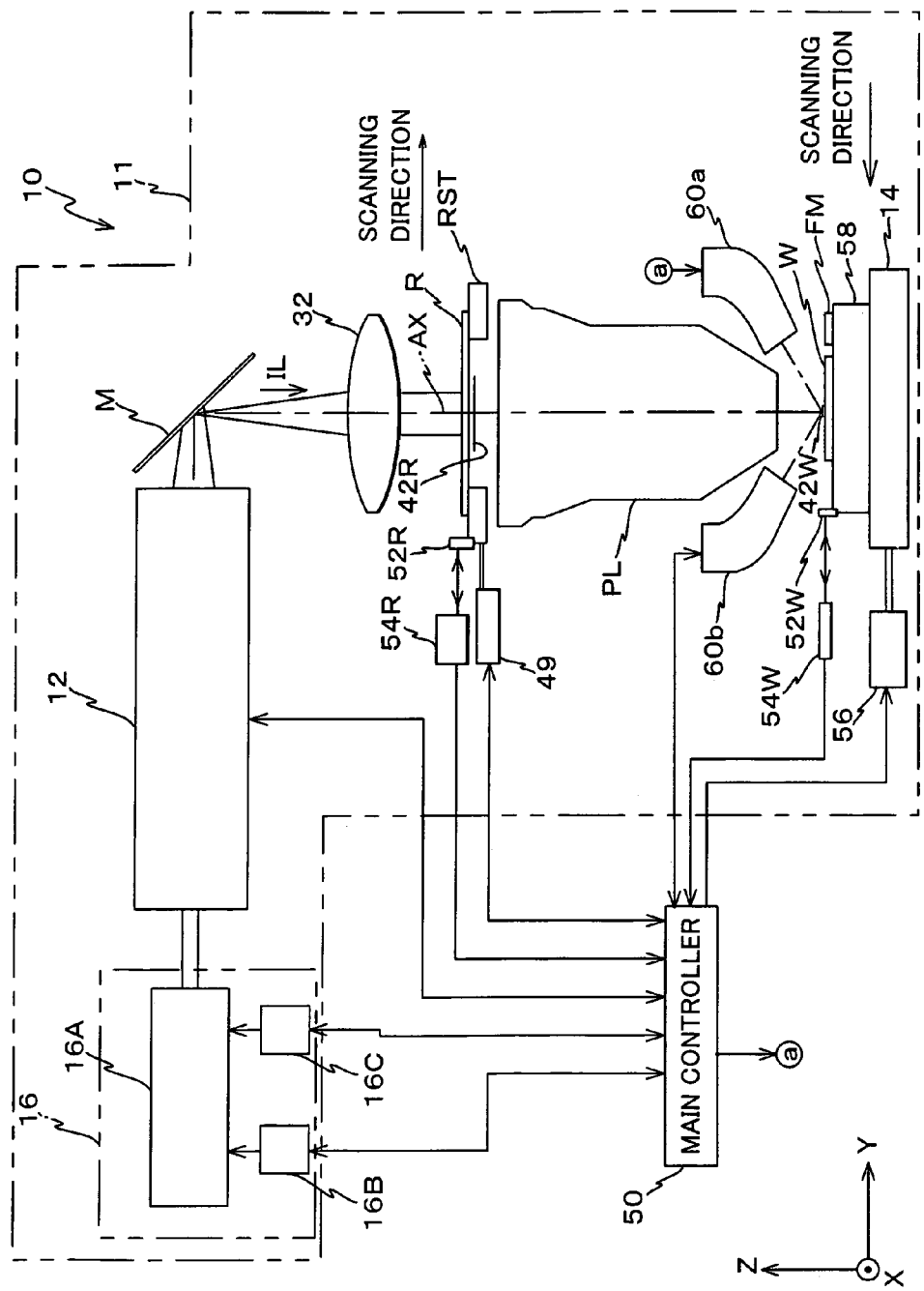
FIG. 1 is a view that schematically shows the structure of an exposure apparatus related to a first embodiment of the present invention.

FIG. 1 shows a schematic structure of an exposure apparatus 10, which is a light irradiation unit related to the first embodiment being structured including a light source unit related to the present invention. Exposure apparatus 10 is a scanning exposure apparatus based on a step-and-scan method.

Exposure apparatus 10 comprises: an illumination system, which is made up of a light source unit 16 and an illumination optical system 12; a reticle stage RST that holds a reticle R serving as a mask, which is illuminated by an exposure illumination light (hereinafter referred to as "illumination light" or "exposure light") IL emitted from the illumination system; a projection optical system PL that projects exposure light IL on a wafer W serving as a photosensitive object via reticle R; an XY stage 14 on which a Z-tilt stage 58 for holding wafer W is mounted, and a control system or the like of these components.

Light source unit 16 is, for example, a unit that outputs ultraviolet pulsed light having the wavelength of 193.4 nm (substantially the same wavelength as an ArF excimer laser beam). Light source unit 16 is housed inside an environmental chamber (hereinafter referred to as a "chamber") 11 where temperature, pressure, humidity and the like are precisely adjusted, along with an exposure apparatus main body, which is made up of illumination optical system 12, reticle stage RST, projection optical system PL, Z-tilt stage 58, XY stage 14, a main body column (not shown) in which these components are incorporated, and the like. In the first embodiment, all the components of light source unit 16 are arranged inside chamber 11, however, light source unit 16 may be partially arranged inside chamber 11, such as in the case, for example, when only the wavelength converter (which will be described later) is arranged inside chamber 11, particularly on the same frame as that of illumination optical system 12, and the wavelength converter and the main body portion of light source unit 16 are connected with an optical fiber or the like.

Figure 2:
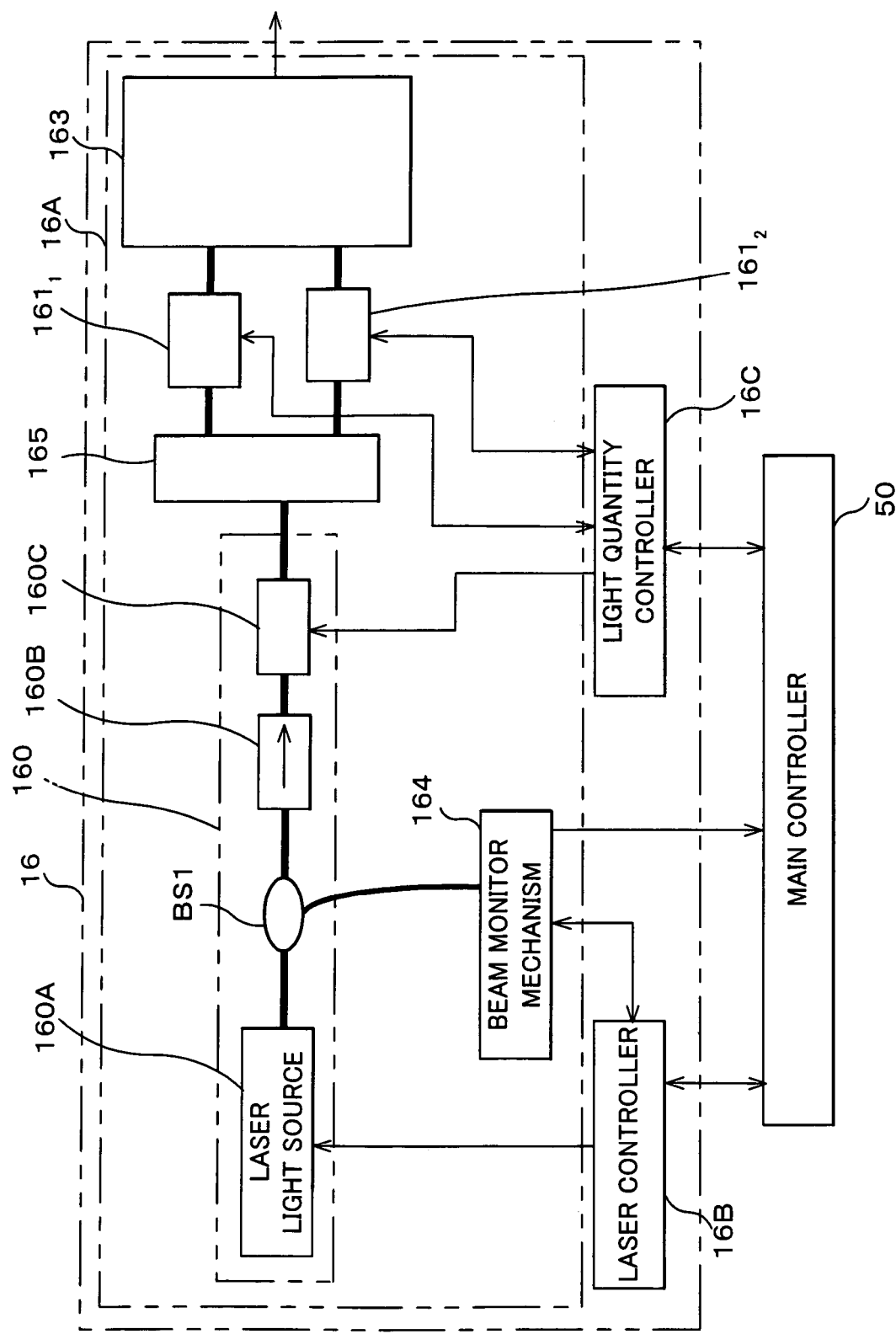
FIG. 2 is a block diagram of an internal structure of a light source unit in FIG. 1, together with a main controller.

FIG. 2 shows an internal structure of light source unit 16 in a block diagram, along with a main controller 50 that has overall control of the entire exposure apparatus 10. As is shown in FIG. 2, light source unit 16 comprises: a light source section 16A; a laser controller 16B; a light quantity controller 16C, and the like.

Light source section 16A comprises: a pulsed light generating section 160; optical amplifiers $161_1$ and $161_2$; a wavelength converter 163; a beam monitor mechanism 164; a beam splitter 165, and the like.

Pulsed light generating section 160 has a laser light source 160A, an optical coupler BS1, an optical isolator 160B, an electrooptical modulator 160C serving as an optical modulator (hereinafter referred to as an "EOM"), and the like. Each element from laser light source 160A to wavelength converter 163 is optically connected by the optical fiber or the like.

As laser light source 160A, in this case, a single wavelength oscillation laser is used, such as an InGaAsP DFB (distributed feedback type) semiconductor laser whose oscillation wavelength is near 1.5 μm and continuous wave output (hereinafter referred to as a "CW output") is 20 mW. Hereinafter, laser light source 160A will be appropriately referred to as a "DFB semiconductor laser 160A". DFB semiconductor laser 160A is a semiconductor laser in which a diffraction grating is fabricated instead of a Fabry-Perot resonator that has low longitudinal mode selectivity, and the semiconductor laser is structured so as to perform single longitudinal mode oscillation under any circumstances. In such a laser, because it basically performs single longitudinal mode oscillation, the oscillation spectrum line width can be suppressed to 0.01 pm and under.

DFB semiconductor laser 160A is normally provided on a heatsink, and both the laser and heatsink are stored in a housing. In the first embodiment, a thermoregulator (such as a Peltier element) is provided on an annex heat sink to DFB semiconductor laser 160A, and the oscillation wavelength can be controlled (adjusted) by laser controller 16B controlling its temperature.

As optical coupler BS1, a coupler whose transmittance is about 97% is used. Therefore, the laser beam from the DFB semiconductor laser 160A diverges into two beams; one which is around 97% propagating to optical isolator 160B in the following step, and the remaining beam around 3%, which enters beam monitor mechanism 164.

Beam monitor mechanism 164 includes an energy monitor (not shown) made up of photoelectric conversion elements such as photodiodes. The output from the energy monitor is supplied to main controller 50 via laser controller 16B, and main controller 50 detects the energy power of the laser beam based on the output from the energy monitor, and controls the light quantity of laser beam oscillated in DFB semiconductor laser 160A via laser controller 16B, when necessary.

Optical isolator 160B allows only the beam proceeding from optical coupler BS1 to EOM 160C to pass, and blocks the beam that proceeds in the opposite direction. Optical isolator 160B prevents the change in the oscillation mode of the DFB semiconductor laser 160A, noise or the like caused by reflected light (returning light).

EOM 160C converts the laser beam (CW beam (continuous light)) having passed through optical isolator 16B into pulsed light. As EOM 160C, an electrooptical modulator (such as a dual electrode modulator) is used that has an electrode structure on which chirp correction has been performed, so as to narrow the wavelength broadening of the semiconductor laser due to chirp. EOM 160C outputs a pulsed light, which is modulated in sync with a voltage pulse applied from light quantity controller 16C. The optical pulse train output from EOM 160C is shorter than the time required for pumping all the additive elements in an amplifying optical fiber 175 of optical amplifiers $161_1$ and $161_2$ (which will be described later), therefore it can be regarded as continuous light from the amplifying point of view of amplifying optical fiber 175. For example, EOM 160C modulates the laser beam oscillated by DFB semiconductor laser 160A into pulsed light having a pulse width of 1 ns and a repetition frequency of 100 kHz (pulse cycle: about 10 μs). As the repetition frequency, a value that can suppress the influence of ASE (Amplified Spontaneous Emission) noise in the optical fiber amplifier is chosen.

Along with the applied voltage of EOM 160C and the control of current applied to DFB semiconductor laser 160A, the output light is preferably pulsed. In such a case, extinction ratio can be improved. This allows pulsed light of a narrow pulse width to be easily generated while the extinction ratio is improved and oscillation interval of the pulsed light and start/stop of oscillation can be controlled easily, compared with the case when using only EOM160C. Further, an acoustic optical modulator (AOM) can also be used instead of the EOM 160C.

Beam splitter 165 splits the pulsed light outgoing from the pulsed light generating section 160 into two, and outputs the split lights to optical amplifiers $161_1$ and $161_2$.

Figure 3:
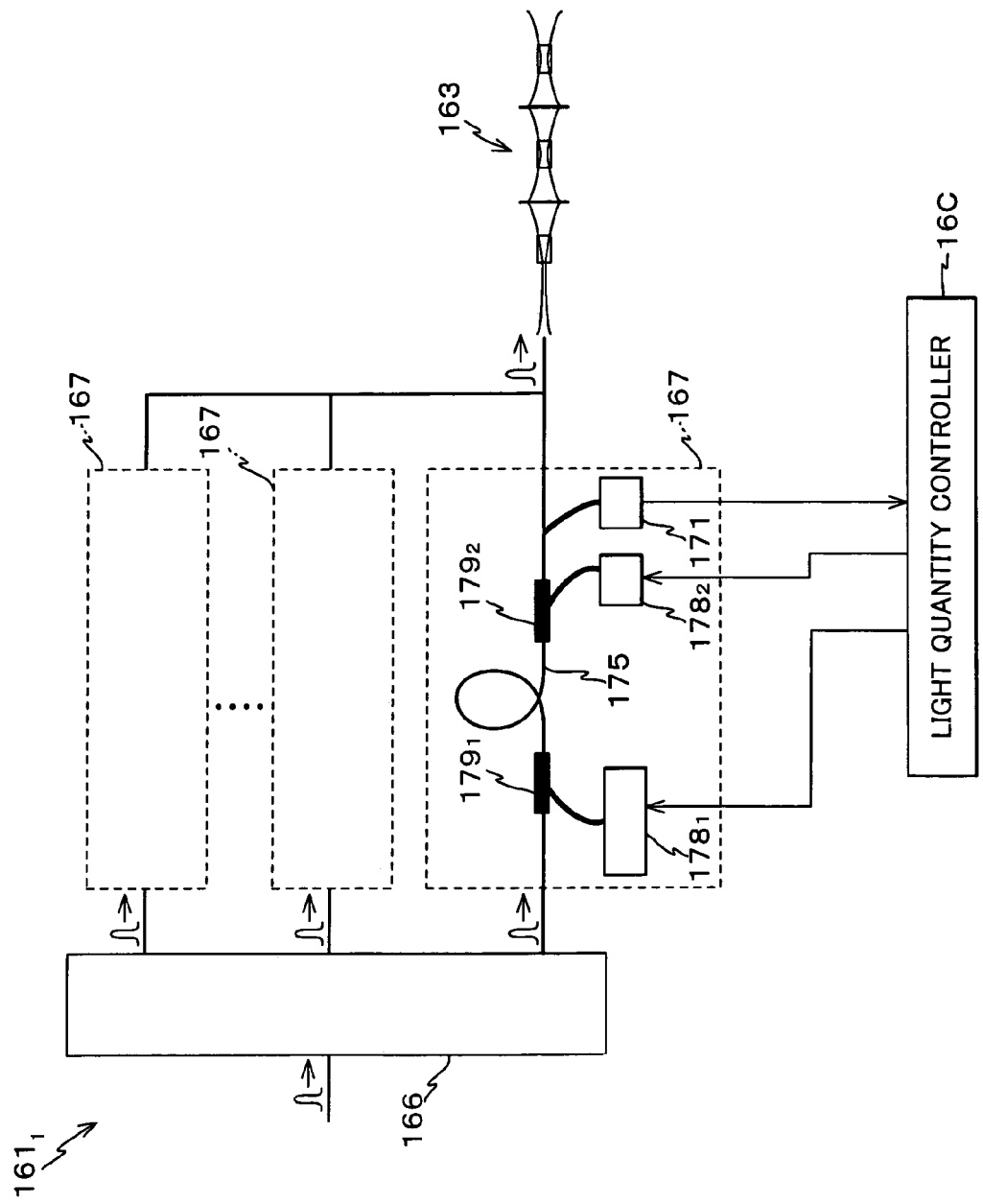
FIG. 3 is a view that schematically shows an optical fiber amplifier and its peripheral sections structuring an optical amplifier in FIG. 2, together with a part of a wavelength converter.

Optical amplifiers $161_1$ and $161_2$ amplify the pulsed lights from beam splitter 165. FIG. 3 shows a structure of one optical amplifier $161_1$. As is shown in FIG. 3, one optical amplifier $161_1$ includes an optical branching device 166 that periodically sorts and diverges (128 branches, for example) the pulsed light from beam splitter 165 in temporal order, and an optical fiber amplifier 167 as a plurality of optical amplifiers.

Optical fiber amplifier 167, as is shown in FIG. 3, comprises: amplifying optical fiber 175 serving as an amplifying medium; pumping semiconductor lasers 178₁ and 178₂ that generate exciting light; and wavelength division multiplexers (WDM) 179₁ and 179₂ that synthesize the output light of beam splitter 165 described above and the exciting light and supply the synthesized light obtained in this manner to amplifying optical fiber 175. Herein, pumping semiconductor laser 178₁ and WDM 179₁ are used in forward pumping, and the pumping semiconductor lasers 178₂ and the WDM 179₂ are used in backward pumping. This arrangement maintains linearity of the optical amplifying ratio with respect to input light brightness and improves the optical amplifying ratio.

As amplifying optical fiber 175, an optical fiber is used whose main material is silica glass or phosphate glass. The optical fiber also has a core/cladding whose core is doped in erbium (Er) with high density. Specifically, optical fiber amplifier 167 is an erbium-doped optical fiber amplifier.

In optical fiber amplifier 167 structured in the manner described above, when a pulsed light enters amplifying optical fiber 175 via WDM 179₁ and propagates the core of amplifying optical fiber 175 in a state where the exciting lights generated by pumping semiconductor lasers 178₁ and 178₂ are supplied via WDM 179₁ and 179₂, an induced radiation is generated and the pulsed light amplified. In such optical amplifying, because amplifying optical fiber 175 has a high amplifying ratio, high brightness pulsed light is output whose unity of wavelength is high. Therefore, a narrow-banded light can be efficiently obtained.

Optical amplifiers 161₁ and 161₂ amplify each of a plurality of lights outgoing from optical branching device 166 by one optical fiber amplifier 167. However, the output lights may each be amplified by a plurality of optical fiber amplifiers, or the optical fiber amplifier may be provided at least in between beam splitter 165 and optical amplifiers 161₁ and 161₂, or at an upstream side of beam splitter 165 (for example, in between the splitter and pulsed light generating section 160, inside pulsed light generating section 160, or the like).

Pumping semiconductor lasers 178₁ and 178₂ generate light whose wavelength is shorter than the oscillation wavelength in DFB semiconductor laser 160A, as the exciting light. The exciting light is supplied to amplifying optical fiber 175 via WDM 179₁ and 179₂, which pumps the electrons of Er outside the shell and generates a so-called energy level population inversion. Pumping semiconductor lasers 178₁ and 178₂ operate under the control of light quantity controller 16C.

Each optical fiber amplifier 167 branches a part of the output light, and a photoelectric conversion element 171 provided at the end of each branch photoelectrically converts each branched light. The output signals of photoelectric conversion element 171 are supplied to light quantity controller 16C.

Light quantity controller 16C feedback controls the drive current of pumping semiconductor lasers 178₁ and 178₂ so as to make the light output from each optical fiber amplifier 167 stable (that is, balanced). The other optical amplifier 161₂ is also structured in a similar manner as in optical amplifier 161₁ described above.

Returning to FIG. 2, wavelength converter 163 includes a plurality of nonlinear optical crystals, and converts the wavelength of the amplified pulsed light (light having a wavelength of 1546.9 nm) into an eighth harmonic so as to generate pulsed ultraviolet light that has substantially the same output wavelength as the ArF excimer laser (output wavelength: 193.4 nm).

Figure 4:
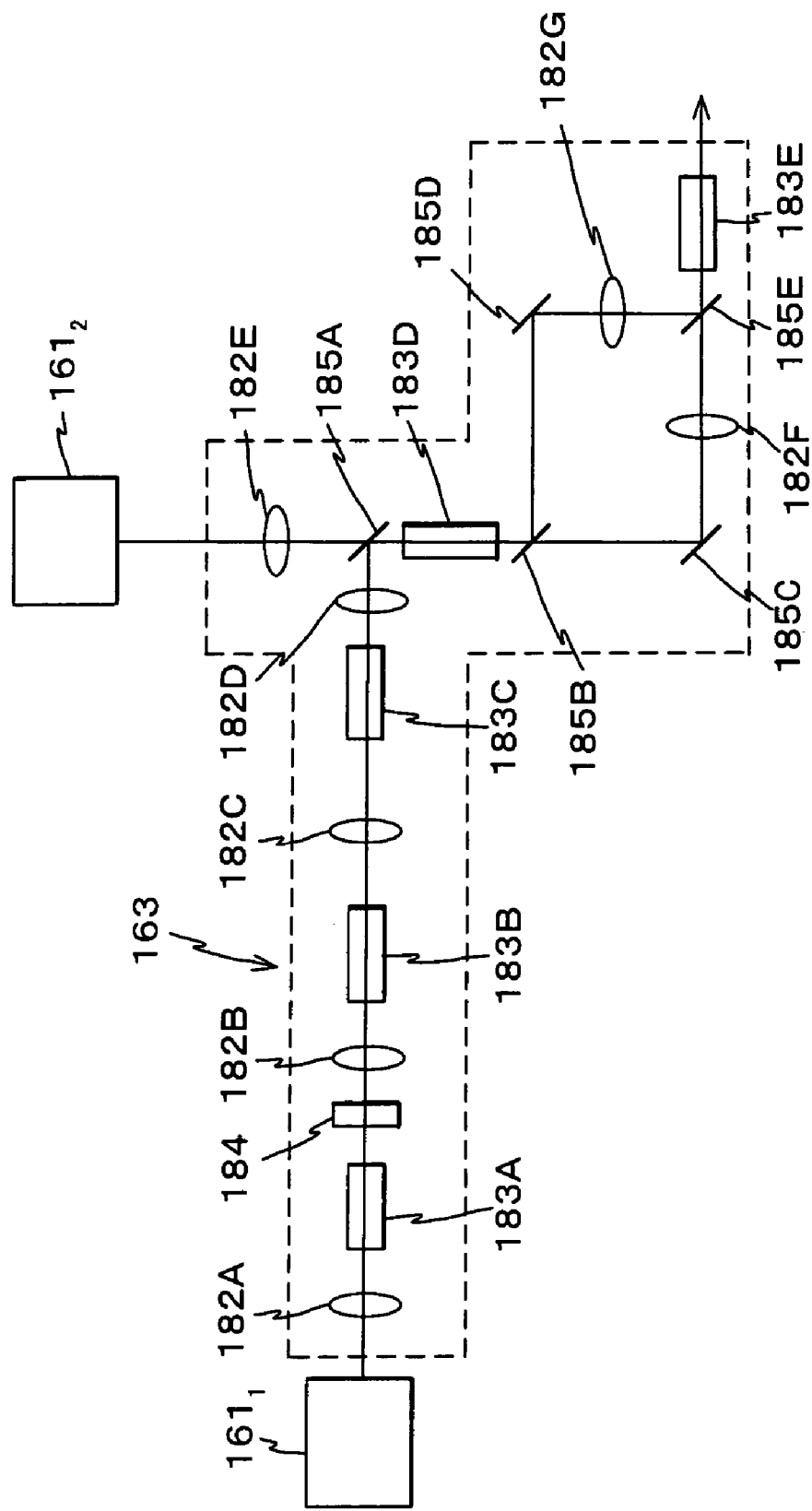
FIG. 4 is a view showing an example of a structure of a wavelength converter that can obtain light having a wavelength of 193.4 nm.

FIG. 4 shows an example of a structure of wavelength converter 163. Herein, a specific example of wavelength converter 163 will be described based on FIG. 4. In wavelength converter 163 of FIG. 4, wavelength conversion is performed in the order of: fundamental wave (wavelength: 1546.9 nm)→double wave (wavelength: 773.5 nm)→triple wave (wavelength: 515.6 nm)→sixfold wave (wavelength: 257.8 nm)→sevenfold wave (wavelength: 221.0 nm)→eightfold wave (wavelength: 193.4 nm).

More specifically, the fundamental wave having the wavelength of 1546.9 nm (frequency:ω) that has been output from optical amplifier 161₁ enters a nonlinear optical crystal 183A of the first step via a condenser lens 182A. When the fundamental wave passes through nonlinear optical crystal 183A, by secondary harmonic generation, a double wave having a frequency twice the frequency ω of the fundamental wave, that is, frequency 2ω (wavelength is ½ that is 773.5 nm) is generated.

An $LiB_3O_5$ (LBO) crystal is used as nonlinear optical crystal 183A of the first step, and for the phase matching to convert the fundamental wave to a double wave, a method by adjusting the temperature of the LBO crystal, which is NCPM (Non-Critical Phase Matching), is used. In the NCPM, because angular misalignment (walk-off) between the fundamental wave and the secondary harmonic does not occur in the nonlinear optical crystal, conversion to a double wave is possible with high efficiency, and it is also advantageous for the generated double wave because the beam is not deformed due to the walk-off.

The fundamental wave that has passed through nonlinear optical crystal 183A without wavelength conversion and the double wave generated by the wavelength conversion of nonlinear optical crystal 183A are given the delay of a half-wavelength and one wavelength by a wave plate 184 respectively in the next step. Then, the polarization direction of only the fundamental wave is rotated by 90 degrees. This allows the polarization directions of the fundamental wave and the double wave to match. The fundamental wave and the double wave, which have passed through wave plate 184, enter a nonlinear optical crystal 183B of the second step, via a condenser lens 182B. As nonlinear optical crystal 183B of the second step, for example, an LBO crystal is used and phase matching by the NCPM is performed on the LBO crystal at a different temperature from that of nonlinear optical crystal (LBO crystal) 183A of the first step. In nonlinear optical crystal 183B, a triple wave (wavelength: 515.6 nm) of the fundamental wave is obtained due to the generation of sum-frequency of the double wave generated in nonlinear optical crystal 183A of the first step and the fundamental wave that has passed through nonlinear optical crystal 183A without wavelength conversion.

Next, the triple wave obtained in nonlinear optical crystal 183B enters a nonlinear optical crystal 183C of the third step via a condenser lens 182C. Then, when the triple wave passes through nonlinear optical crystal 183C of the third step, by secondary harmonic generation, a sixfold wave having a frequency six times the frequency ω of the fundamental wave, that is, frequency 6ω) (the wavelength is ⅙, which is 257.8 nm), is generated. As nonlinear optical crystal 183C of the third step, for example, a β-BaB$_2$O$_4$ (BBO) crystal or a CsLiB$_6$O$_{10}$ (CLBO) crystal is used.

The sixfold wave obtained in nonlinear optical crystal 183C is reflected by a dichroic mirror 185A after passing through a condenser lens 183D, and is synthesized coaxially with the fundamental wave having the wavelength of 1546.9 nm (frequency:ω), which has been output from optical amplifier 161$_2$ and has passed through a condenser lens 182E. The synthesized wave then enters a nonlinear optical crystal 183D of the fourth step.

As nonlinear optical crystal 183D of the fourth step, for example, the CsLiB$_6$O$_{10}$ (CLBO) crystal is used. In nonlinear optical crystal 183D, a sevenfold wave (wavelength: 221.0 nm) is obtained by the generation of sum-frequency of the fundamental wave and the sixfold wave. In the structure described above, the CsB$_3$O$_5$ (CBO) crystal can be used, instead of CLBO crystal 183D used for generating the sevenfold wave.

The sevenfold wave obtained in nonlinear optical crystal 183D and the fundamental wave having passed through the crystal are separated by a dichroic mirror 185B. The fundamental wave having passed through the mirror is reflected by a dichroic mirror 185C, and reaches a dichroic mirror 185E after passing through a condenser lens 182F. Then, the sevenfold wave reflected by dichroic mirror 185B is reflected by a mirror 185D and reaches dichroic mirror 185E after passing through a condenser lens 182G. Then, the fundamental wave and the sevenfold wave are coaxially synthesized by dichroic mirror 185E, and the synthesized wave enters a nonlinear optical crystal 183E of the fifth step. For shaping the beam of the sevenfold wave, a pair of cylindrical lens can also be used, instead of condenser lens 182G.

As nonlinear optical crystal 183E of the fifth step, for example, the CsLiB$_6$O$_{10}$ (CLBO) crystal is used, and an eightfold wave (wavelength: 193.4 nm) is obtained by the generation of sum-frequency of the fundamental wave and the sevenfold wave. In the structure described above, an LiB$_4$O$_7$ (LB4) crystal can be used instead of CLBO crystal 183E for generating the eightfold wave.

In wavelength converter 163 structured in the manner described above, by performing wavelength conversion on the fundamental wave (wavelength: 1546.9 nm), which is amplified by the optical amplifiers 161$_1$ and 161$_2$ in five steps, light having the target wavelength of 193.4 nm is obtained.

Returning to FIG. 1, illumination optical system 12 comprises an illuminance uniformity optical system including an optical integrator, a relay lens, a variable ND filter, a reticle blind, a dichroic mirror, and the like (all are not shown). Herein, as the optical integrator, a fly-eye lens, an internal reflection type integrator (such as a rod integrator), a diffractive optical element or the like is used. Details on the structure of such illumination optical system 12 are disclosed in, for example, Japanese Patent Application Laid-open No.H06-349701 and the corresponding U.S. Pat. No. 5,534,970 or the like. The above disclosures of the U.S. Patent are fully incorporated herein by reference. The optical path of exposure light IL outgoing from illumination optical system 12 is bent vertically downward by a mirror M, and after that exposure light IL passes through a condenser lens 32 and then illuminates a rectangular illumination area 42R on reticle R, which is held on reticle stage RST, with a uniform illuminance distribution.

Reticle R is mounted on reticle stage RST and held by suction via a vacuum chuck (not shown). Reticle stage RST can be finely driven within a horizontal plane (XY plane) and is also scanned in a scanning direction (in this case, the Y-axis direction, which is the lateral direction of the page surface) by a reticle stage drive section 49 in a predetermined stroke range. The position and the rotation amount of reticle stage RST during the scanning are measured by an external laser interferometer 54R via a movable mirror 52R fixed on reticle stage RST, and the measurement values of laser interferometer 54R are supplied to main controller 50.

The material used for reticle R depends on the wavelength of exposure light IL. Specifically, when the exposure light output from light source unit 16 is light having the wavelength of 193 nm as in the first embodiment, synthetic quartz can be used, however, when the exposure light output from light source unit 16 is light having the wavelength of 157 nm, as it will be described later, the reticle must be made of fluorite, fluoride-doped synthetic quartz, crystal, or the like.

Projection optical system PL is, for example, a double telecentric reduction optical system, and it is made up of a plurality of lens elements that have a common optical axis AX in the Z-axis direction. As projection optical system PL, a system that has a projection magnification β of, for example, ¼, ⅕ or ⅙, is used. Therefore, as is described above, when exposure light IL illuminates illumination area 42R of reticle R, projection optical system PL reduces and projects the pattern formed on reticle R at projection magnification β, and the image is transferred onto a slit shaped exposure area 42W on wafer W whose surface is coated with a resist (photosensitive agent).

XY stage 14 is made so that it can be driven two-dimensionally by a wafer stage drive section 56, in the Y-axis direction, which is a scanning direction, and the X-axis direction orthogonal to the Y-axis direction (the orthogonal direction of the page surface in FIG. 1). On Z-tilt stage 58 mounted on XY stage 14, wafer W is held by vacuum chucking or the like via a wafer holder (not shown). Z-tilt stage 58 adjusts the position of wafer W in the Z-axis direction position (focus position) by three actuators (such as piezo elements or voice coil motors), and also has the function to adjust the angle of inclination of wafer W with respect to the XY plane (image plane of projection optical system PL). In addition, the position of XY stage 14 is measured with an external laser interferometer 54W via a movable mirror 52W fixed on Z-tilt stage 58, and the measurement values of laser interferometer 54W is supplied to main controller 50.

Herein, the movable mirror is actually an X movable mirror that has a reflection surface perpendicular to the X-axis and a Y movable mirror that has a reflection surface perpendicular to the Y-axis, and as the laser interferometer corresponding to these mirrors, interferometers are each provided for measuring the X-axis position, the Y-axis position, and rotation (including yawing amount, pitching amount, and rolling amount). However, in FIG. 1, these are representatively shown as movable mirror 52W and laser interferometer 54W.

On Z-tilt stage 58, a fiducial mark plate FM is provided, which is used when performing reticle alignment or the like that will be described later in the description. Fiducial mark plate FM is arranged so that its surface is substantially at the same height as the surface of wafer W. On the surface of fiducial mark plate FM, fiducial marks are formed, such as fiducial marks for reticle alignment and fiducial marks for baseline measurement.

Furthermore, although it is not shown in FIG. 1 to avoid complexity of the drawing, exposure apparatus 10 actually comprises, for example, a reticle alignment system based on an image processing method, in order to perform reticle alignment.

When alignment of reticle R is performed, first of all, main controller 50 drives reticle stage RST and XY stage 14 via reticle stage drive section 49 and wafer stage drive section 56 so that the fiducial marks used in reticle alignment formed on fiducial mark plate FM are set on the periphery of exposure area 42W described earlier, and the relative positions of reticle R and Z-tilt stage 58 are set so that the reticle mark images on reticle R substantially overlap the fiducial marks. In such a state, main controller 50 images both marks using the reticle alignment system, and then main controller 50 processes the imaging signals of the marks to calculate the positional shift amount of the projected image of the reticle marks with respect to their corresponding fiducial marks in the X-axis direction and the Y-axis direction. When imaging such marks, because the images picked up are the images via projection optical system PL, light having substantially the same wavelength as the wavelength of exposure light IL is used.

Further, it is also possible to obtain focus offset or leveling offset (such as focal point position and inclination of the image plane of projection optical system PL) based on contrast information, which is included in the detection signals (image signals) of the projected image of the fiducial marks obtained as a result of the above-described reticle alignment.

In addition, in the first embodiment, when the reticle alignment described above is performed, main controller 50 also performs measurement of the baseline quantity (the positional relationship between the projection position of the reticle and the alignment sensor) of an off-axis alignment sensor (not shown) provided on the side surface of projection optical system PL on the wafer side, using a predetermined mark on the fiducial mark plate.

Moreover, as is shown in FIG. 1, exposure apparatus 10 of the first embodiment has a light source whose on/off is controlled by main controller 50, and also in exposure apparatus 10, a multiple point focal position detection system (a focus sensor) of an oblique incident method is provided. The system is made up of an irradiation system 60a, which irradiates image forming beams in order to form a large number of pinhole or slit images on the image forming surface of projection optical system PL from an oblique direction with respect to optical axis AX, and a photodetection optical system 60b that receives the image forming beams reflected off the surface of wafer W. A detailed configuration of a multiple point focal position detection system (a focus sensor) similar to the one described in the first embodiment is disclosed in, for example, Japanese Patent Application Laid-open No.H06-283403 and its corresponding U.S. Pat. No. 5,448,332 or the like, and the disclosures of the U.S. Patent referred to above are fully incorporated herein by reference.

On scanning exposure or the like, main controller 50 sequentially calculates the Z position of the surface of a part of a shot area where the measurement points are located and the amount of inclination based on the detected Z position of each measurement point from photodetection system 60b, and controls the Z position and the angle of inclination of Z-tilt stage 58 via a drive system (not shown) based on the calculation results. Thus, auto-focusing (automatic focus adjustment) and auto-leveling are executed.

Main controller 50 comprises a so-called microcomputer (or a workstation), which is made up of a CPU (central processing unit), a ROM (read-only memory), a RAM (random access memory) and the like, and besides performing various controls that have been described so far, for example, it controls synchronous scanning of reticle R and wafer W, stepping operation of wafer W, exposure timing and the like so that exposure operation is precisely performed. Further, in the first embodiment, besides performing dose control on scanning exposure, which will be described later in the description, main controller 50 also has overall control over the entire apparatus.

More specifically, during scanning exposure, main controller 50 controls the position and the velocity of reticle stage RST and XY stage 14 via reticle stage drive section 49 and wafer stage drive section 56, respectively, based on the measurement values of laser interferometers 54R and 54W, so that reticle R is scanned in the +Y direction (or −Y direction) at the velocity of $V_R = V$ via reticle stage RST and wafer W is synchronously scanned with respect to exposure area 42W in the −Y direction (or +Y direction) at the velocity of $V_W = \beta \cdot V$ ($\beta$ is the projection magnification from the reticle R to the wafer W) via XY stage 14. Further, on stepping operations, main controller 50 controls the position of XY stage 14 via wafer stage drive section 56, based on measurement results of laser interferometer 54W.

Next, an exposure sequence for performing the exposure of a reticle pattern onto a predetermined number of wafers W (N wafers) using exposure apparatus 10 of the first embodiment will be described, mainly focusing on control operations of main controller 50.

Firstly, main controller 50 loads reticle R subject to exposure on reticle stage RST using a reticle loader (not shown).

Then, the main controller performs reticle alignment using the reticle alignment system, as well as baseline measurement.

Next, the main controller 50 instructs a wafer carriage system (not shown) to exchange wafer W. With this operation, wafer exchange is performed (when a wafer is not available on the stage, only wafer loading is performed) by the wafer carriage system and a wafer delivery mechanism (not shown) on XY stage 14, and then processing is performed of a series of alignment processes as in the so-called search alignment and fine alignment (such as EGA). Because such wafer exchange and wafer alignment are performed in the same manner as that of a well-known exposure apparatus, further description of the details will be omitted. Details on such an exposure apparatus are disclosed, for example, Japanese Patent Application Laid-open No.S61-44429 and its corresponding U.S. Pat. No. 4,780,617 or the like, and the disclosures cited in the above U.S. patent are fully incorporated herein by reference.

Next, based on the alignment results described above and shot map data, an operation to move wafer W to a scanning starting position (an acceleration starting position) for exposing each shot area on wafer W and the scanning exposure operation described above are performed repeatedly, and the reticle pattern is transferred onto a plurality of shot areas on wafer W by the step-and-scan method. During such scanning exposure, main controller 50 gives instructions to light quantity controller 16C described above to provide an integrated dose decided according to the exposure condition and resist sensitivity, and performs exposure light quantity control.

When exposure of the first wafer W is completed, main controller 50 instructs the wafer carriage system (not shown) to exchange wafer W. With this instruction, the wafer carriage system and the wafer delivery mechanism (not shown) on the XY stage 14 perform wafer exchange, and then search alignment and fine alignment are performed to the exchanged wafer in the same manner as is described above.

Then, in a similar manner as is described above, the reticle pattern is transferred onto the plurality of shot areas on wafer W based on the step-and-scan method.

When illuminance changes due to a change in at least one of the exposure conditions and the reticle pattern, it is desirable to control at least one of the frequency and peak power referred to earlier so as to provide wafer W (resist) an appropriate dose. At this point, in addition to or instead of at least one of the frequency and the peak power, the scanning speed of reticle R and wafer W may be adjusted.

As is described above in detail, in the first embodiment, in wavelength converter 163 that converts light having the wavelength of 1546.9 nm into light having a predetermined wavelength (193.4 nm) step by step, in the wavelength conversion on and after the fourth step by nonlinear optical crystals 183D and 183E, light output from optical amplifier $161_2$ is used as the fundamental wave. This allows the wavelength conversion on and after the fourth step (such as sum-frequency of the fundamental wave and the sixfold wave of the fundamental wave obtained from optical amplifier $161_1$) to be performed using a fundamental wave obtained from optical amplifier $161_2$, instead of a fundamental wave whose output level is attenuated after having passed nonlinear optical crystals 183A to 183C that are used in several steps of wavelength conversion. Accordingly, in the light source unit of the first embodiment, higher wavelength conversion efficiency can be obtained when compared to a conventional light source unit.

Conversely, in the wavelength conversion using the fundamental wave on and after the fourth step, because the fundamental wave obtained from another optical amplifier $161_2$ is used, the output level of the fundamental wave from optical amplifier $161_1$ does not have to be increased to a level used in the wavelength conversion on and after the fourth step. Thus, in the light source unit of the first embodiment, the peak power of the output from optical amplifier $161_1$ used for the wavelength conversion of the first step can be suppressed. When the peak power is suppressed, there is an advantage that the spectrum of light output from optical amplifier $161_1$ can be further narrowbanded, thus light source unit 16 is particularly useful in an apparatus, such as in exposure apparatus 10, that requires the usage of light with narrow line width.

Furthermore, according to exposure apparatus 10 of the first embodiment, illumination light IL with high brightness can be irradiated on reticle R on scanning exposure, therefore the pattern formed on reticle R can be efficiently transferred onto wafer W with good accuracy. Furthermore, the throughput can be also improved.

Although in the first embodiment described above, light source unit 16 comprises only one pulsed light generating section 160 as a light supply source for each of the two optical amplifiers $161_1$ and $161_2$, however, the unit may comprise two pulsed light generating sections 160, which comprise laser light sources 160A, as the light supply source for each of the two optical amplifiers $161_1$ and $161_2$. In such an occasion, it goes without saying that light source unit 16 does not need to comprise beam splitter 165.

Figure 5:
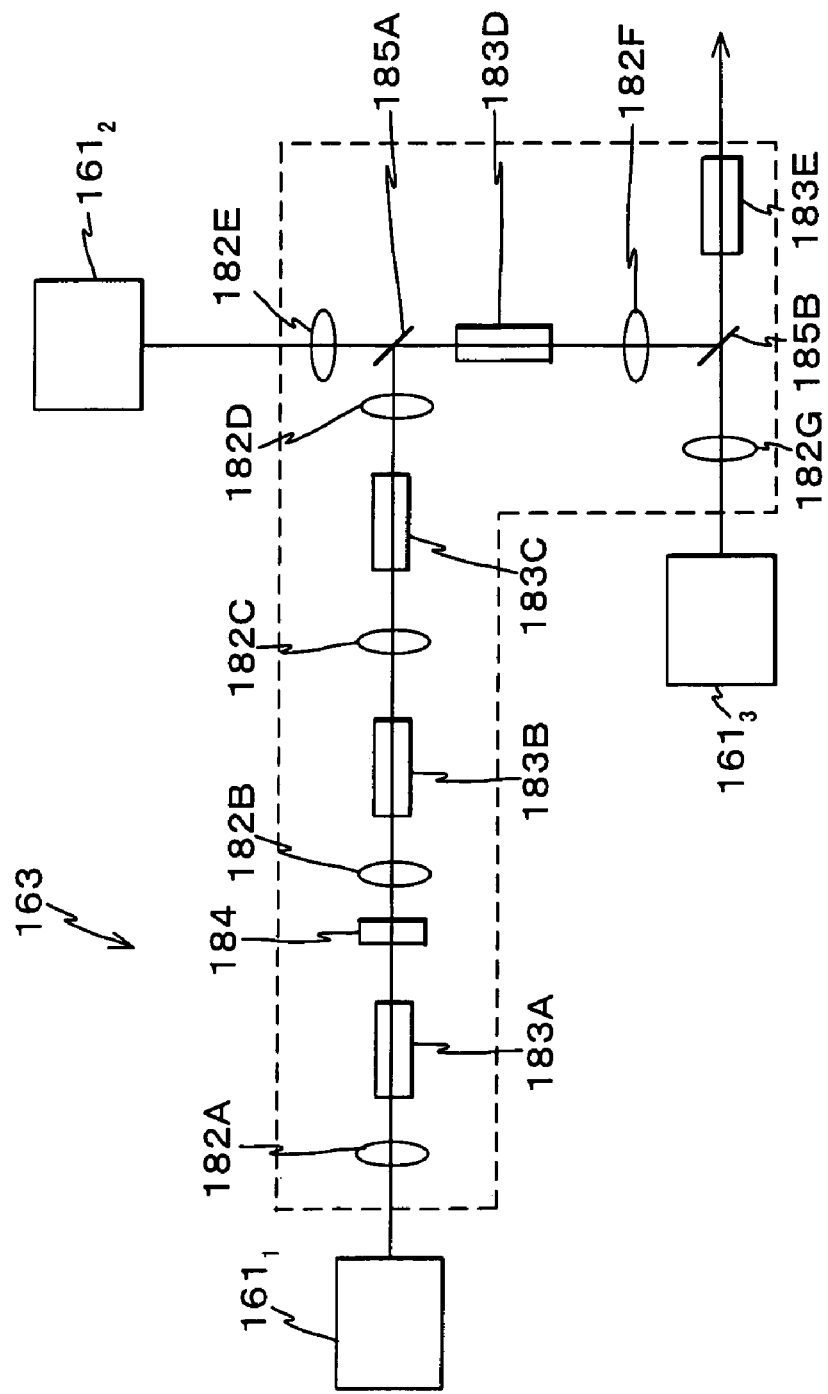
FIG. 5 is a view showing another example of a structure of a wavelength converter that can obtain light having a wavelength of 193.4 nm.

In addition, in the first embodiment above, optical amplifiers for outputting the fundamental wave to wavelength converter 163 are two optical amplifiers $161_1$ and $161_2$. However, the present invention is not limited to this, and the unit may comprise three or more optical amplifiers. FIG. 5 shows the configuration of wavelength converter 163 when the unit comprises three optical amplifiers. Herein, light source unit 16 further comprises an optical amplifier $161_3$ as the third optical amplifier. Similar to optical amplifiers $161_1$ and $161_2$, light branched by beam splitter 165 may enter optical amplifier $161_3$, or alternatively, light output from another pulsed light generating section different from pulsed light generating section 160 may enter the amplifier.

As shown in FIG. 5, wavelength converter 163 is the same as wavelength converter 163 in FIG. 4 on the point that it includes a plurality of nonlinear optical crystals and performs wavelength conversion on the amplified pulsed light (light having the wavelength of 1546.9 nm) and converts it into an eighth harmonic to generate pulsed ultraviolet light having approximately the same output wavelength (193.4 nm) as the oscillation wavelength of the ArF excimer laser.

Wavelength converter 163 of FIG. 5 performs wavelength conversion in the same manner as wavelength converter 163 shown in FIG. 4, in the order of the fundamental wave (wavelength: 1546.9 nm)→double wave (wavelength: 773.5 nm)→triple wave (wavelength: 515.6 nm)→sixfold wave (wavelength: 257.8 nm) sevenfold wave (wavelength: 221.0 nm)→eightfold wave (wavelength: 193.4 nm). And, because the configuration and the operation of elements in wavelength converter 163 of FIG. 5 until the nonlinear optical crystal 183D where the sevenfold wave is obtained are the same as those of wavelength converter 163 of FIG. 4, their description will be omitted.

As is shown in FIG. 5, the sevenfold wave obtained in nonlinear optical crystal 183D is synthesized coaxially at dichroic mirror 185B via condenser lens 182F, with the light output from optical amplifier $161_3$ that has passed through condenser lens 182G, and then enters nonlinear optical crystal 183E.

As nonlinear optical crystal 183E of the fifth step, a $CsLiB_6O_{10}$ (CLBO) crystal is used and an eightfold wave (wavelength: 193.4 nm) is obtained due to the sum-frequency of the fundamental wave and the sevenfold wave.

As is described above, as the fundamental wave that enters nonlinear optical crystal 183E of the fifth step, wavelength converter 163 of FIG. 5 uses the fundamental wave input from optical amplifier $161_3$, instead of the fundamental wave that is input from optical amplifier $161_2$ and has passed through nonlinear optical crystal 183D of the fourth step. Therefore, the wavelength conversion of the fifth step can be performed using the fundamental wave obtained from optical amplifier $161_3$, instead of the fundamental wave whose output level is attenuated after having passed through nonlinear optical crystal 183D. Accordingly, by using wavelength converter 163 of FIG. 5, even higher wavelength conversion efficiency can be obtained than the case when using wavelength converter 163 of FIG. 4. Furthermore, in wavelength converter 163 of FIG. 5, the number of dichroic mirrors can be reduced when compared to wavelength converter 163 of FIG. 4 (from three dichroic mirrors 185A, 185B, and 185E to two mirrors), and because there is no need to provide a route to make the fundamental wave detour the sevenfold wave, a simple configuration can be employed. The wavelength conversion efficiency can be further increased by performing beam shaping as is described above, using a pair of cylindrical lens for correcting walk-off after nonlinear optical crystals 183C and 183D. A wavelength plate or such pair of cylindrical lens can also be appropriately used in other routes of light.

Figure 6A:
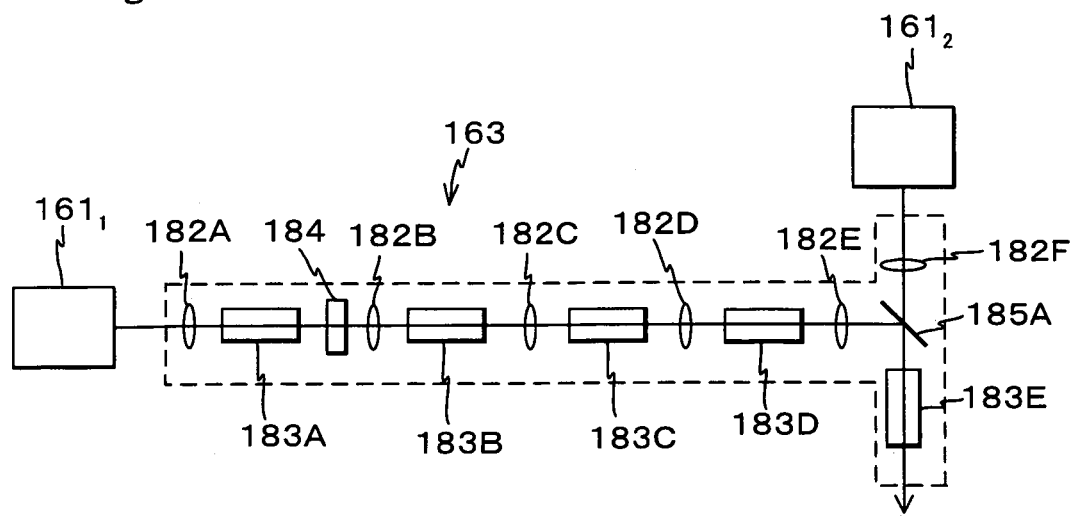
FIG. 6A is a view showing a modified example (No. 1) of a structure of the wavelength converter.
Figure 6B:
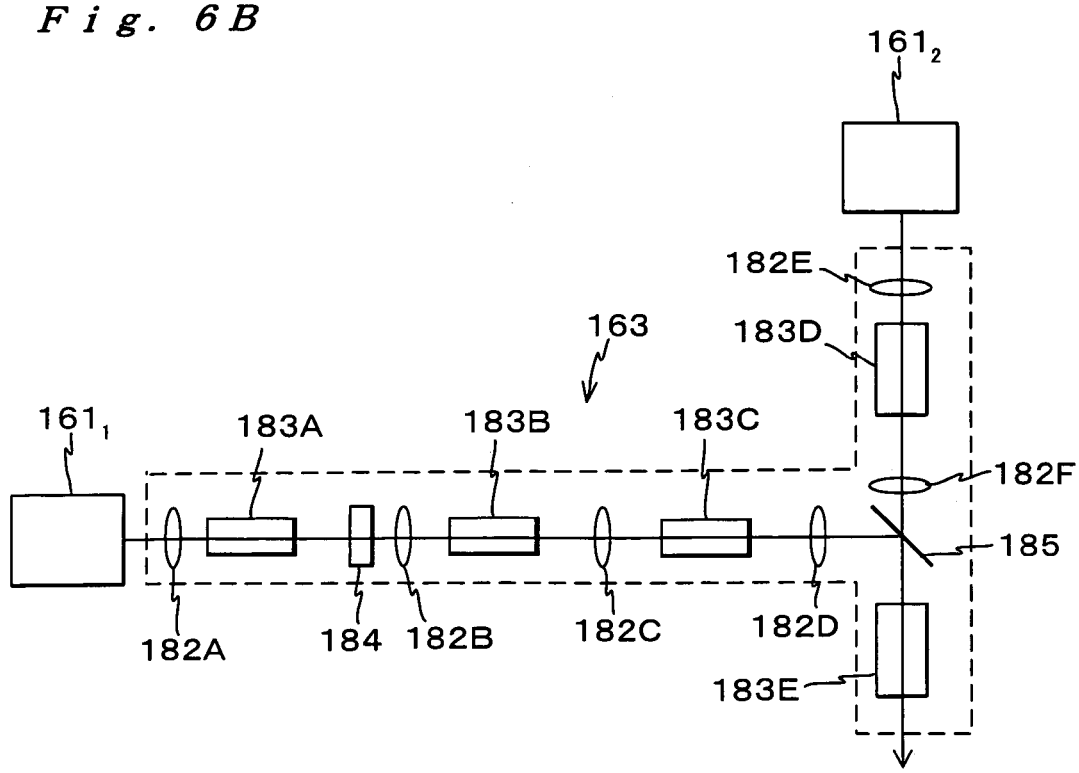
FIG. 6B is a view showing a modified example (No. 2) of a structure of the wavelength converter.

In addition to the examples described above, various modified examples of wavelength converter 163 may also be considered. FIGS. 6A and 6B show modified examples of a configuration of wavelength converter 163. In wavelength converter 163 shown in FIGS. 6A and 6B, wavelength conversion is performed in the order of the fundamental wave (wavelength: 1546.9 nm)→double wave (wavelength: 773.5 nm)→triple wave (wavelength: 515.6 nm)→fourfold wave (wavelength: 386.7 nm) sevenfold wave (wavelength: 221.0 nm)→eightfold wave (wavelength: 193.4 nm). Because the configuration of wavelength converter 163 of FIG. 6A until nonlinear optical crystal 183B where the triple wave is obtained is the same as that of wavelength converter 163 of FIG. 4, their description will be omitted.

As is shown in FIG. 6A, the fundamental wave that has passed through nonlinear optical crystal 183B without wavelength conversion and the triple wave generated due to the wavelength conversion by nonlinear optical crystal 183B pass through condenser lens 183C and enter nonlinear optical crystal 183C of the third step. Then, due to the generation of sum-frequency of the fundamental wave and the triple wave, a fourfold wave having the frequency four times the frequency $\omega$ of the fundamental wave, that is, frequency $4\omega$) is generated (wavelength is ¼ that is 386.7 nm). As nonlinear optical crystal 183C, a $Gd_xY_{1-x}Ca_4O$ $(BO_3)_3$ (GdYCOB) crystal, for example, is used. NCPM (Non Critical Phase Matching) is used in the GdYCOB as well.

Next, the triple wave that has passed through nonlinear optical crystal 183C without wavelength conversion and the fourfold wave generated due to the wavelength conversion by nonlinear optical crystal 183C enter nonlinear optical crystal 183D of the fourth step via condenser lens 182D. Then, when the triple wave and the fourfold wave pass through nonlinear optical crystal 183D of the fourth step, a sevenfold wave having the frequency seven times the frequency $\omega$ of the fundamental wave, that is, frequency $7\omega$ is generated (wavelength is 1/7 that is 221.0 nm) due to the generation of sum-frequency of the triple wave and the fourfold wave. As nonlinear optical crystal 183D of the fourth step, for example, the $\beta\text{-}BaB_2O_4$ (BBO) crystal is used.

The sevenfold wave obtained in nonlinear optical crystal 183D is reflected by dichroic mirror 185A after passing through condenser lens 182E, synthesized coaxially with the fundamental wave having the wavelength of 1546.9 nm (frequency: $\omega$) that has been output from optical amplifier 161$_2$, and then is made to enter nonlinear optical crystal 183E of the fifth step.

As nonlinear optical crystal 183E of the fifth step, the $CsLiB_6O_{10}$ (CLBO) crystal is used, and an eightfold wave (wavelength: 193.4 nm) is obtained due to the generation of sum-frequency of the fundamental wave and the sevenfold wave.

In wavelength converter 163 shown in FIG. 6A that has the configuration described above, light having the target wavelength of 193.4 nm is obtained by converting the wavelength of the fundamental wave (wavelength: 1546.9 nm) that has been amplified by optical amplifiers 161$_1$ and 161$_2$.

Furthermore, in wavelength converter 163 shown in FIG. 6B, because the configuration and the operation until the sixfold wave is obtained are the same as those of wavelength converter 163 of FIG. 4, their description will be omitted. As is shown in FIG. 6B, the fundamental wave having the wavelength of 1546.9 nm (frequency: $\omega$) that has been output from optical amplifier 161$_2$ enters nonlinear optical crystal 183D of the fourth step via condenser lens 182E. When the fundamental wave passes through nonlinear optical crystal 183D, a double wave having the frequency twice the frequency $\omega$ of the fundamental wave, that is, frequency $2\omega$) is generated (wavelength is ½, that is 773.5 nm) due to the generation of secondary harmonic.

As nonlinear optical crystal 183D of the fourth step, the $LiB_3O_5$ (LBO) crystal is used and the method by adjusting the temperature of the LBO crystal, which is NCPM (Non-Critical Phase Matching), is used for the phase matching to convert the fundamental wave to a double wave.

The sixfold wave obtained in nonlinear optical crystal 183C is reflected by dichroic mirror 185A after passing through the condenser lens 182D, synthesized coaxially with the double wave generated by the nonlinear optical crystal 183D, and then made to enter nonlinear optical crystal 183E of the fifth step.

As nonlinear optical crystal 183E of the fifth step, $\beta\text{-}BaB_2O_4$ (BBO) crystal is used, and the eightfold wave (wavelength: 193.4 nm) is obtained due to the generation of sum-frequency of the double wave and the sixfold wave.

In wavelength converter 163 shown in FIG. 6B that has the configuration described above, light having the target wavelength of 193.4 nm is obtained by converting the wavelength of the fundamental wave (wavelength: 1546.9 nm) that has been amplified by optical amplifiers 161$_1$ and 161$_2$.

Figure 7A:
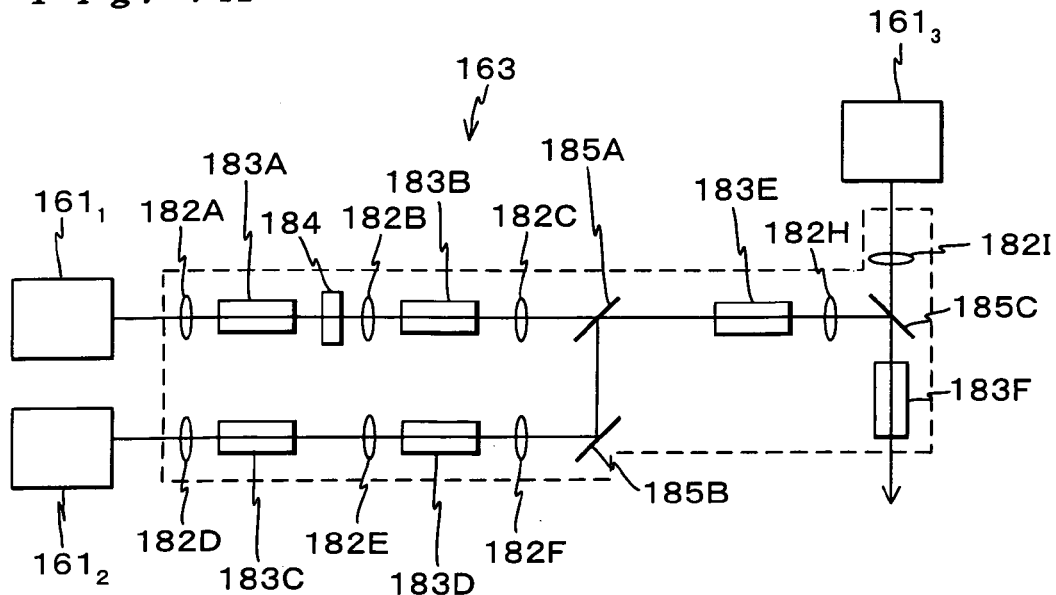
FIG. 7A is a view showing a modified example (No. 3) of a structure of the wavelength converter.
Figure 7B:
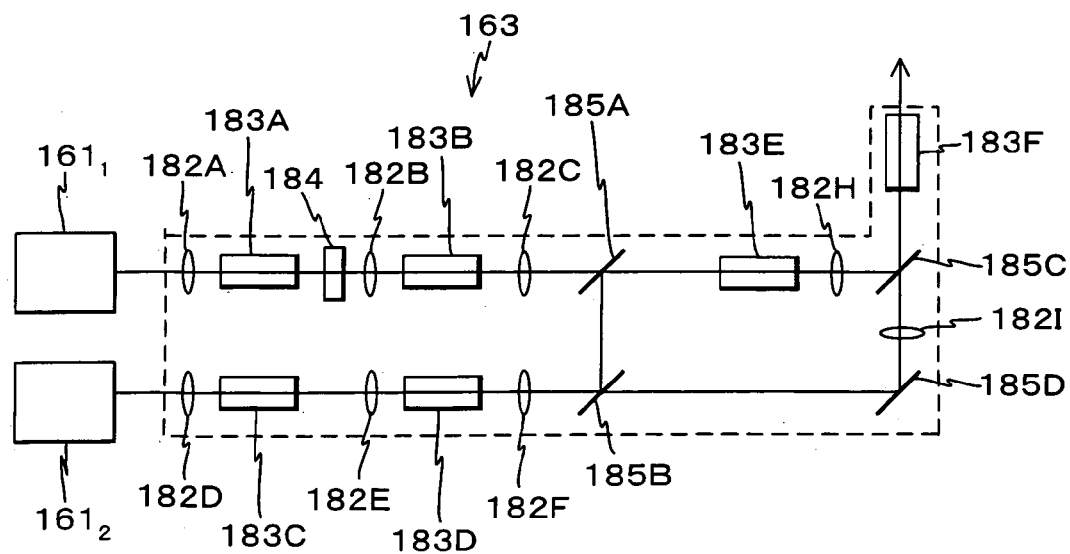
FIG. 7B is a view showing a modified example (No. 4) of a structure of the wavelength converter.

FIGS. 7A and 7B show other modified examples of a configuration of wavelength converter 163. In wavelength converter 163 shown in FIGS. 7A and 6B, wavelength conversion is performed in the order of the fundamental wave (wavelength: 1546.9 nm)→double wave (wavelength: 773.5 nm)→triple wave (wavelength: 515.6 nm)→sevenfold wave (wavelength: 221.0 nm)→eightfold wave (wavelength: 193.4 nm). Because the configuration of wavelength converter 163 of FIG. 7A is the same as that of the wavelength converter 163 of FIG. 4, from the point of inputting the fundamental wave having the wavelength of 1546.9 nm (frequency: $\omega$) that has been output from the optical amplifier 161$_1$ until nonlinear optical crystal 183B where the triple wave is obtained, the description thereabout will be omitted.

On the other hand, other than the wavelength conversion described above, wavelength converter 163 of FIGS. 7A and 7B also performs wavelength conversion in the order of the fundamental wave (wavelength: 1546.9 nm)→double wave (wavelength: 773.5 nm)→fourfold wave (wavelength: 386.7 nm) in order to obtain a fourfold wave (wavelength: 386.7 nm) that is used in the conversion described above from the triple wave (wavelength: 515.6 nm) to the sevenfold wave.

As is shown in FIG. 7A, the fundamental wave having the wavelength of 1546.9 nm (frequency: $\omega$) that has been output from optical amplifier 161$_2$ enters nonlinear optical crystal 183C of the first step via condenser lens 182D. When the fundamental wave passes through nonlinear optical crystal 183C, a double wave having a frequency twice the frequency $\omega$ of the fundamental wave, that is, frequency $2\omega$) is generated (wavelength is ½, which is 773.5 nm) due to the generation of secondary harmonic. As nonlinear optical crystal 183C of the first step, the LBO crystal is used, and the method by adjusting the temperature of the LBO crystal, which is NCPM (Non-Critical Phase Matching) is used for the phase matching to convert the fundamental wave to a double wave.

Then, when the double wave passes through nonlinear optical crystal 183D of the second step, a fourfold wave having the frequency four times the frequency co of the fundamental wave, that is, frequency $4\omega$ is generated (wavelength is ¼ that is 386.7 nm) due to the generation of secondary harmonic. As the nonlinear optical crystal 183D, the LBO crystal is used The fourfold wave obtained in nonlinear optical crystal 183D enters nonlinear optical crystal 183E of the third step after passing through condenser lens 182F, being reflected by mirror 185B and dichroic mirror 185A and synthesized coaxially with the triple wave that has been obtained in non-linear optical crystal 183B that has passed through condenser lens 182C. As the nonlinear optical crystal 183E of the third step, the BBO crystal is used. In nonlinear optical crystal 183E, a sevenfold wave (wavelength: 221.0 nm) is obtained due to the generation of sum-frequency of the triple wave and the fourfold wave.

The sevenfold wave obtained in nonlinear optical crystal 183E is reflected by dichroic mirror 185C after passing through a condenser lens 182H, and is synthesized coaxially with the fundamental wave having the wavelength of 1546.9 nm (frequency: $\omega$) output from optical amplifier 161$_3$ and having passed through a condenser lens 182I, and then it enters nonlinear optical crystal 183F of the fourth step.

As nonlinear optical crystal 183F of the fourth step, the CLBO crystal is used and an eightfold wave (wavelength: 193.4 nm) is obtained due to the generation of sum-frequency of the fundamental wave and the sevenfold wave.

In wavelength converter 163 shown in FIG. 7A that has the configuration described above, light having the target wavelength of 193.4 nm is obtained by converting the wavelength of the fundamental wave (wavelength: 1546.9 nm) that has been amplified by optical amplifiers $161_1$, $161_2$, and $161_3$.

The configuration of wavelength converter 163 of FIG. 7B is the same as that of the wavelength converter 163 of FIG. 7A from the point of inputting the fundamental wave having the wavelength of 1546.9 nm (frequency: ω) that has been output from optical amplifier $161_1$ until nonlinear optical crystal 183B where the triple wave is obtained and from the point of inputting the fundamental wave having the wavelength of 1546.9 nm (frequency: ω) that has been output from optical amplifier $161_2$ until nonlinear optical crystal 183D where the fourfold wave is obtained.

The fourfold wave that has been obtained in nonlinear optical crystal 183D of the second step and has passed through condenser lens 182F is reflected by dichroic mirrors 185B and 185A. Accordingly, the fourfold wave is synthesized coaxially with the triple wave that has been obtained in nonlinear optical crystal 183B of the second step and has passed through condenser lens 182C, and then enters nonlinear optical crystal 183E of the third step. Thus, the sevenfold wave is obtained in nonlinear optical crystal 183E of the third step as in wavelength converter 163 of FIG. 7A.

On the other hand, the fundamental wave, which has been output from optical amplifier $161_2$ and has passed through condenser lens 182D, nonlinear optical crystal 183C, condenser lens 182E, nonlinear optical crystal 183D and condenser lens 182F, then passes through dichroic mirror 185B and is reflected by the mirror 185D, and then it passes through condenser lens 182I and reaches dichroic mirror 185C.

Then, the sevenfold wave that has been obtained in nonlinear optical crystal 183E and has passed through condenser lens 182H is reflected by dichroic mirror 185C, and is synthesized coaxially with the fundamental wave that has been made to enter by mirror 185D, then it enters nonlinear optical crystal 183F of the fourth step.

As nonlinear optical crystal 183F, the CLBO crystal is used as in wavelength converter of FIG. 7A, and an eightfold wave (wavelength: 193.4 nm) is obtained due to the generation of sum-frequency of the fundamental wave and the sevenfold wave.

In wavelength converter 163 shown in FIG. 7B that has the configuration described above, light having the target wavelength of 193.4 nm is obtained by converting the wavelength of the fundamental wave (wavelength: 1546.9 nm) that has been amplified by optical amplifiers $161_1$ and $161_2$.

As is described above, with wavelength converter 163 of FIGS. 7A and 7B, light having the wavelength of 193.4 nm can be obtained by the four step configuration of nonlinear optical crystals, which allows a higher wavelength conversion efficiency to be obtained than that of wavelength converter 163 of FIGS. 6A, 6B where nonlinear optical crystals have a five step configuration.

Furthermore, although the light source unit of the first embodiment is an apparatus to convert the wavelength of light so that it nears 193 nm. However, the present invention is not limited to this, and the invention can be applied to a light source unit that outputs light whose wavelength is converted to another wavelength, such as a wavelength approximately the same as the oscillation wavelength of the $F_2$ laser.

Figure 8:
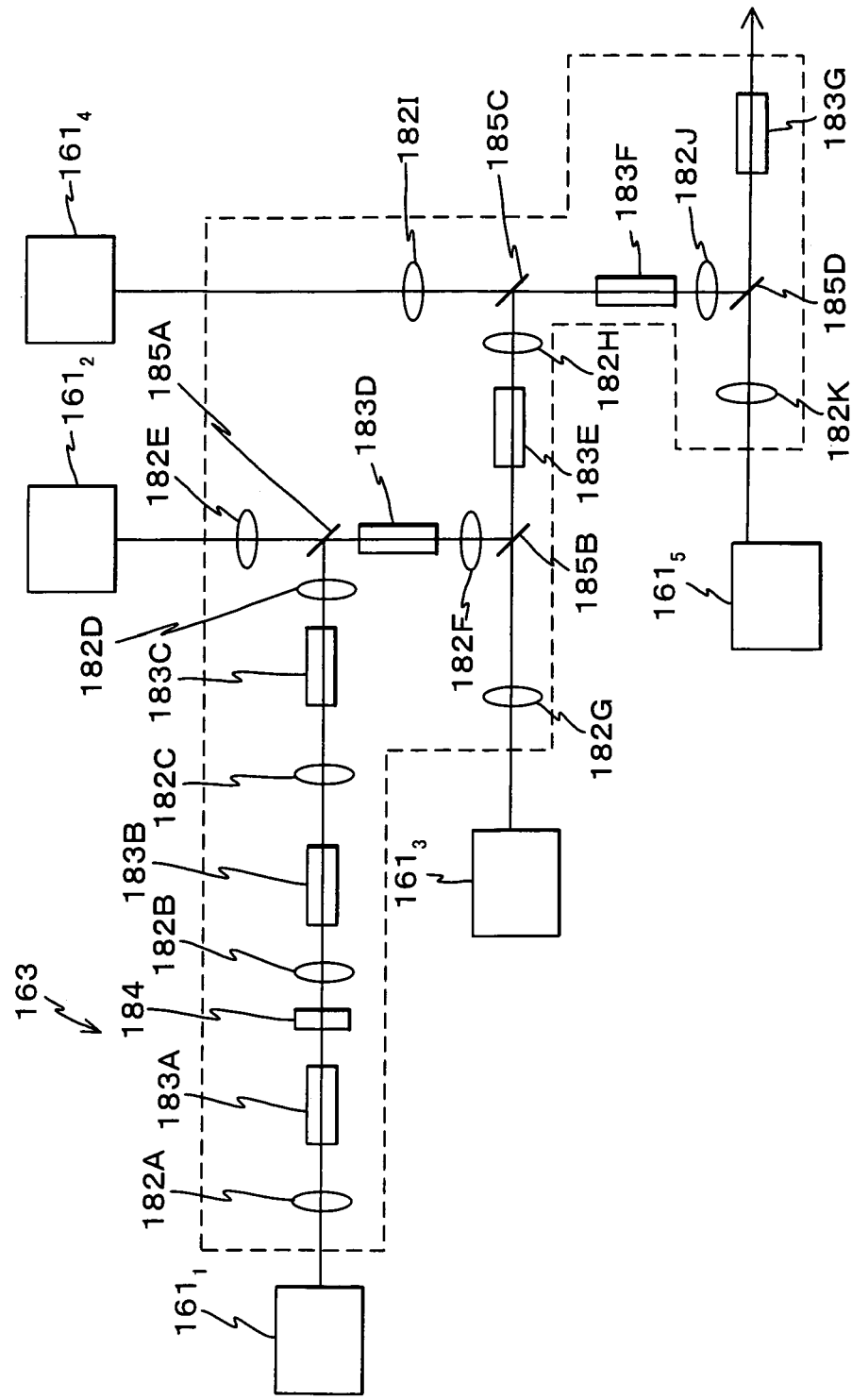
FIG. 8 is a view showing an example of a structure of a wavelength converter that can obtain light having a wavelength of 157.6 nm.

FIG. 8 shows a configuration of wavelength converter 163 that converts light into light having wavelength approximately the same as the oscillation wavelength of the $F_2$ laser. In wavelength converter 163 shown in FIG. 8, wavelength conversion is performed in the order of the fundamental wave (wavelength: 1576 nm)→double wave (wavelength: 788 nm)→triple wave (wavelength: 525.3 nm)→sixfold wave (wavelength: 262.7 nm)→sevenfold wave (wavelength: 225.1 nm)→eightfold wave (wavelength: 197 nm)→ninefold wave (wavelength: 175.1 nm)→tenfold wave (wavelength: 157.6 nm). Because the configuration and the operation of wavelength converter 163 of FIG. 8 are the same as those of wavelength converter 163 of FIG. 5 until it obtains the eightfold wave, the description thereabout will be omitted. Further, in FIG. 8, light source unit 16 comprises five optical amplifiers (optical amplifiers $161_1$ to $161_5$).

As is shown in FIG. 8, the eightfold wave obtained in nonlinear optical crystal 183E and has passed through condenser lens 182H is synthesized coaxially at the dichroic mirror 185C with light output from optical amplifier $161_4$ having passed through condenser lens 182I, and then it enters nonlinear optical crystal 183F.

As nonlinear optical crystal 183F of the sixth step, the CBO crystal or a KBBF ($KBe_2BO_3F_2$: Potassium fluoroboratoberyllate) is used and the ninefold wave (wavelength: 175.1 nm) is obtained due to the generation of sum-frequency of the fundamental wave entering the crystal and the eightfold wave.

The ninefold wave obtained in nonlinear optical crystal 183F is synthesized coaxially at dichroic mirror 185D with light output from optical amplifier $161_5$ having passed through a condenser lens 182K, and then it enters a nonlinear optical crystal 183G. As nonlinear optical crystal 183G of the seventh step, a $BaMgF_4$ (BMF) crystal is used and the tenfold wave (wavelength: 157.6 nm) is obtained due to the sum-frequency of the fundamental wave and the ninefold wave.

The BMF crystal is a nonlinear optical element having a periodic domain inversion structure (hereinafter referred to as a "QPM element" or a "quasi-phase-matching crystal") Since the BMF crystal generates the sum-frequency of the fundamental wave and the ninefold wave by QPM (Quasi-Phase-Matching), walk-off does not occur as in the case of NCPM.

Figure 9:
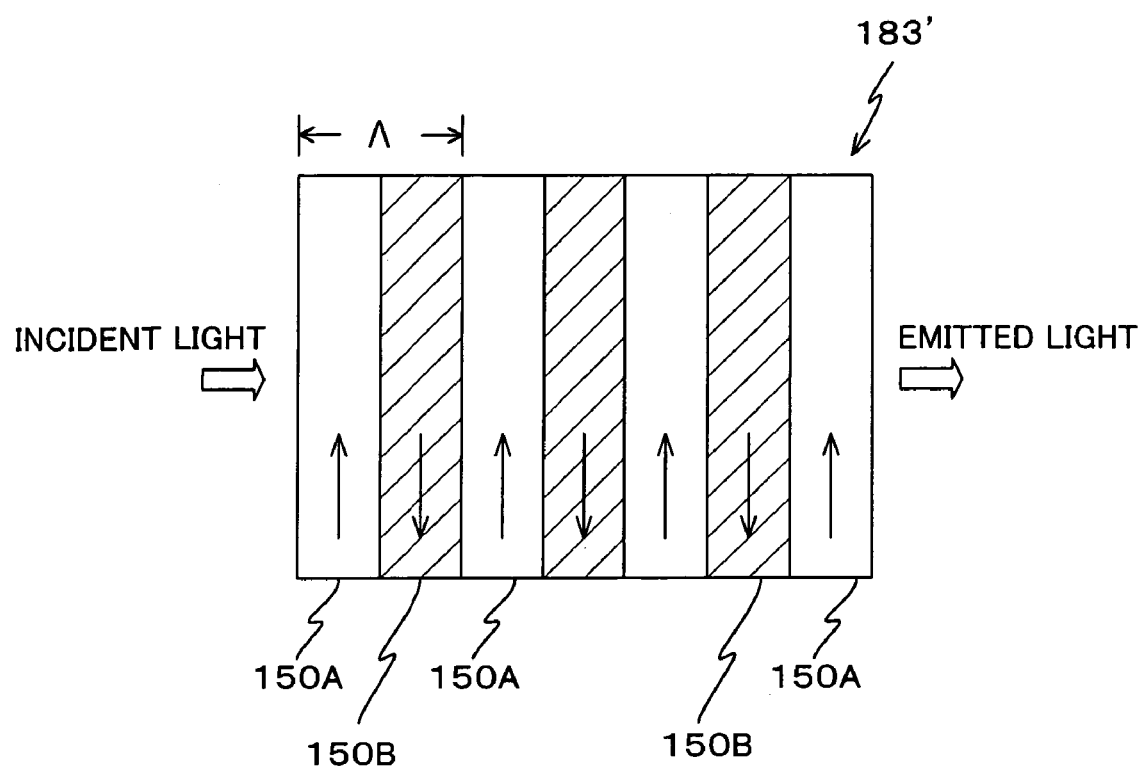
FIG. 9 is a view showing a structure of a QPM element.

As is shown in FIG. 9, a QPM element 183' has a periodic domain inversion structure where areas 150A and areas 150B whose polarization directions (shown by arrows in the vertical direction of the page surface in FIG. 9) are opposite to each other are formed alternately and periodically, along the traveling direction of light.

In the quasi-phase-matching crystal, width Λ of areas 150A and 150B along the traveling direction of light is set as follows.

In the case of generating a secondary harmonic using the quasi-phase-matching crystal, in QPM element 183' where $k_1$ is the absolute value of a wavenumber vector of the incident light and $k_2$ is the absolute value of a wavenumber vector of the secondary harmonic generated, the width is determined as:

$$\Lambda = 2\pi/(k_2 - 2k_1) \quad (1).$$

In the case of generating a sum-frequency, in QPM element 183' where $k_3$ and $k_4$ are the absolute values of wavenumber vectors of incident lights, and $k_5$ is the absolute value of wavenumber vector of secondary harmonic generated, the width is determined as:

$$\Lambda = 2\pi/(k_5 - (k_3 + k_4)) \quad (2).$$

As is described above, the tenfold wave (wavelength: 157.6 nm) is obtained in wavelength converter 163 shown in FIG. 8 using the BaMgF$_4$ (BMF) crystal. In such occasion, it is desirable that incident lights that are made to enter the BMF crystal be the fundamental wave and the ninefold wave, instead of lights such as the double wave and the eightfold wave, or the triple wave and the seven fold wave. This allows the above-described cycle Λ of the BMF crystal to be about 3 μm, which makes the BMF crystal easier to manufacture. When light having the wavelength of 157.6 nm is to be generated, for example, in the BMF crystal by the second harmonic generation, the cycle of the BMF crystal is around 1 μm. That is, cycle Λ can be longer the larger the wavelength difference of the two incident lights is, which allows the crystal to be manufactured easily.

In addition, as such an QPM element 183', there are crystals such as a periodic domain inversion LN (LiNbO$_3$) crystal (PPLN crystal), a periodic domain inversion LT (LiTaO$_3$) crystal (PPLT crystal), a periodic domain inversion KTP (KTiOPO$_4$) crystal (PPKTP crystal), and rock crystal in which the periodic domain inversion structure is formed using stress (hereinafter referred to as a "rock crystal QPM element").

For example, as nonlinear optical crystals 183A and 183B for generating the double wave and the triple wave in wavelength converter 163 shown in FIGS. 4, 5, 6A, 6B, 7A and 7B, the PPKTP crystal or the PPLN crystal, which are the quasi-phase-matching crystals, may be used. Such crystals are suitable for obtaining narrowband light with the wavelength of 193.4 nm. That is, when such crystals are used, wavelength conversion efficiency can be maintained even if the peak power of optical amplifier 161$_1$ or the like is reduced, and the increase of spectrum width caused by SPM (self phase modulation) in an erbium doped fiber can also be suppressed.

Second Embodiment

Next, a second embodiment of the present invention will be described referring to FIGS. 10 to 18. On describing the second embodiment, the reference numerals the same as those in the first embodiment will be used for the same or equivalent components, therefore, the description thereabout will be omitted.

Figure 10:
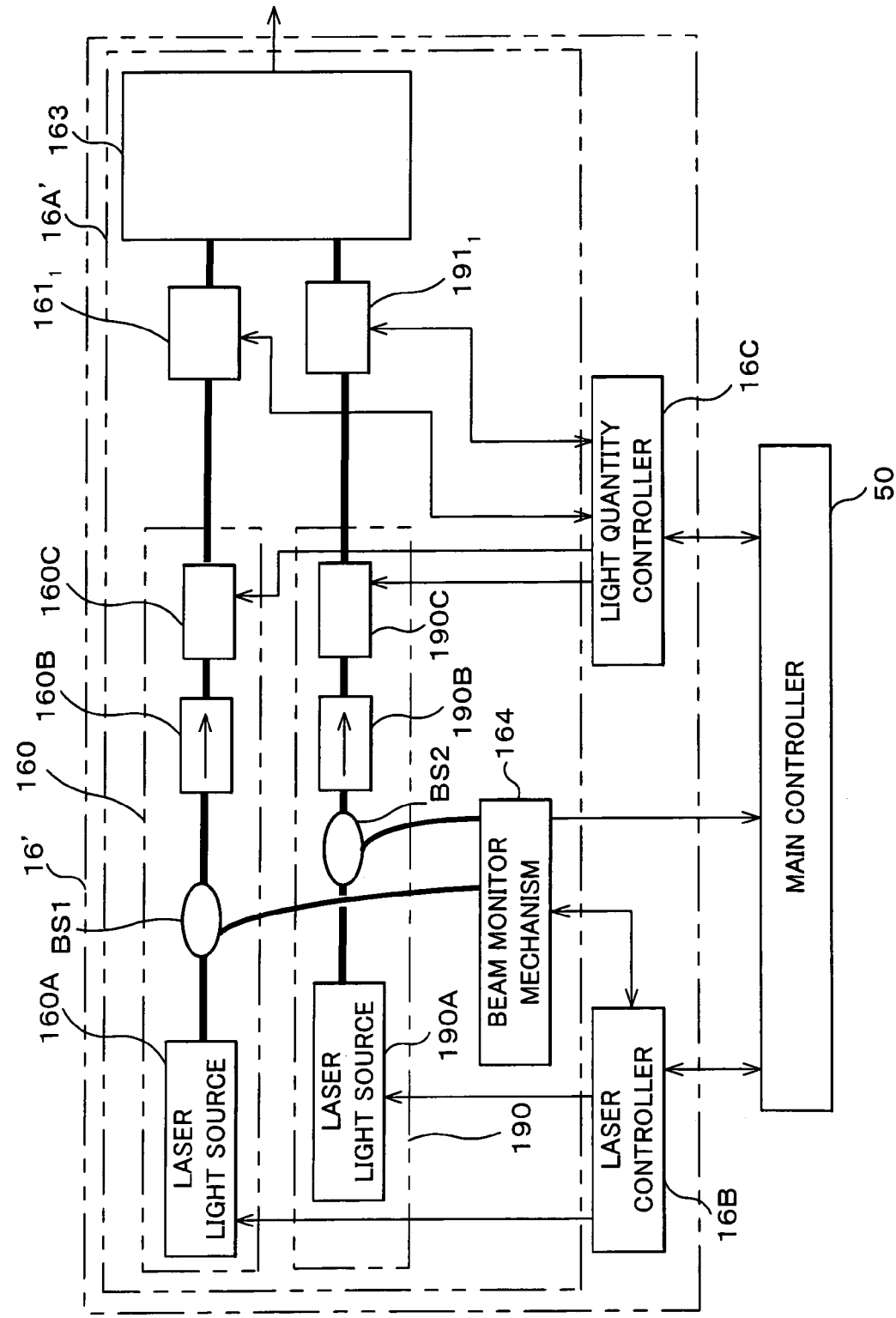
FIG. 10 is a block diagram of an internal structure of a light source unit in a second embodiment of the present invention, together with a main controller.

The exposure apparatus of the second embodiment differs from the exposure apparatus of the first embodiment on the point where the apparatus comprises a light source unit 16' instead of light source unit 16. FIG. 10 schematically shows the configuration of light source unit 16' related to the second embodiment. As is shown in FIG. 10, a light source section 16A' of light source unit 16' differs from light source section 16A of light source unit 16 shown in FIG. 2 on the point where light source 16A' comprises a pulsed light generating section 190 in addition to pulsed light generating section 160 and it also newly comprises an optical amplifier 191$_1$, instead of optical amplifier 161$_2$.

Pulsed light generating section 190 has a laser light source 190A, an optical coupler BS2, an optical isolator 190B, an electro-optical modulator 190C (hereinafter referred to as an "EOM") serving as an optical modulator, and the like. Elements in between laser light source 190A and wavelength converter 163 are optically connected by optical fiber or the like.

The configuration and the operation of laser light source 190A, optical coupler BS2, optical isolator 190B, and EOM 190C are the same as those of laser light source 160A, optical coupler BS1, optical isolator 160B, and EOM 160C. However, as laser light source 190A, for example, a ytterbium (Yb) doped DFB fiber laser with narrow line width having the oscillation wavelength of 1030 nm to 1120 nm, a single wavelength oscillation DFB semiconductor laser, or the like is used. In the following, laser light source 190A will be appropriately referred to as a "DFB semiconductor laser 190A".

Although the configuration of optical amplifier 191$_1$ is almost the same as the configuration of optical amplifier 161$_1$ described in the first embodiment, they are different only on the point where an optical fiber is used whose core of the amplifying optical fiber provided inside optical amplifier 191$_1$ is doped with ytterbium (Yb) at a high density, instead of erbium (Er). In other words, optical amplifier 191$_1$ is an ytterbium doped optical fiber amplifier. The bandwidth of optical amplifier 191$_1$ is 1030 nm or more and 1120 nm or less. Further, similar to optical amplifier 161$_1$, optical amplifier 191$_1$ may amplify a plurality of output lights from the beam splitter by a plurality of ytterbium doped optical fiber amplifiers, or the ytterbium doped optical fiber amplifier may be provided on the upper stream side of optical amplifier 191$_1$ (for example, between the amplifier and pulsed light generating section 190 or inside pulsed light generating section 190).

Beam monitor mechanism 164 monitors the energy of laser light source 160A and laser light source 190A, and based on the output from the energy monitor main controller 50 detects the energy power of the laser beams and controls the light quantity of the laser beams oscillated from DFB semiconductor lasers 160A and 190A via laser controller 16B when necessary.

In addition, light quantity controller 16C performs feedback control on the drive current of pumping semiconductor lasers 178$_1$ and 178$_2$ of the optical amplifiers 161$_1$ and 191$_1$ so that the optical power from each optical fiber amplifier 167 of optical amplifiers 161$_1$ and 191$_1$ becomes stable (that is, balanced).

Wavelength converter 163 includes a plurality of nonlinear optical crystals, and executes wavelength conversion by the amplified pulsed light, that is, light having the wavelength of 1105 nm serving as the first fundamental wave and light having the wavelength of 1546.9 nm serving as the second fundamental wave, and generates pulsed ultraviolet light having the same output wavelength (193.4 nm) as that of the ArF excimer laser.

FIG. 10 only shows erbium doped optical fiber amplifier 161$_1$ and ytterbium doped optical fiber amplifier 191$_1$, however, they may be provided in plural numbers depending on the configuration of wavelength converter 163 (described later) In the case a plurality of erbium doped optical fiber amplifiers are provided, reference numerals such as 161$_1$, 161$_2$ . . . are used, whereas in the case a plurality of ytterbium doped optical fiber amplifiers are provided, reference numerals such as 191$_1$, 191$_2$ . . . are used. Furthermore, in FIG. 10, in light source unit 16', as the light supply source for the two optical amplifiers 161$_1$ and 191$_1$, only one pulsed light generating section is provided for each amplifier, respectively, pulsed light generating section 160 and pulsed light generating section 190. However, as the light supply source for the two optical amplifiers 161$_1$, 161$_2$ . . . and so forth, and 191$_1$, 191$_2$ . . . and so forth, a plurality of pulsed light generating sections 160 and a plurality of pulsed light generating sections 190 that include laser light sources 160A and laser light sources 190A may be provided.

FIGS. 11A, 11B, 12A, and 12B show examples of a configuration of wavelength converter 163 of the second embodiment. Herein, specific examples of wavelength converter 163 will be described based on the drawings.

In wavelength converter 163 of FIGS. 11A, 11B, 12A, and 12B, pulsed ultraviolet light having the same output wavelength (193.4 nm) as the ArF excimer laser is obtained, due to the generation of sum-frequency of the fivefold wave of the first fundamental wave (wavelength: 1105 nm) and the second fundamental wave (wavelength: 1546.9 nm).

Figure 11A:
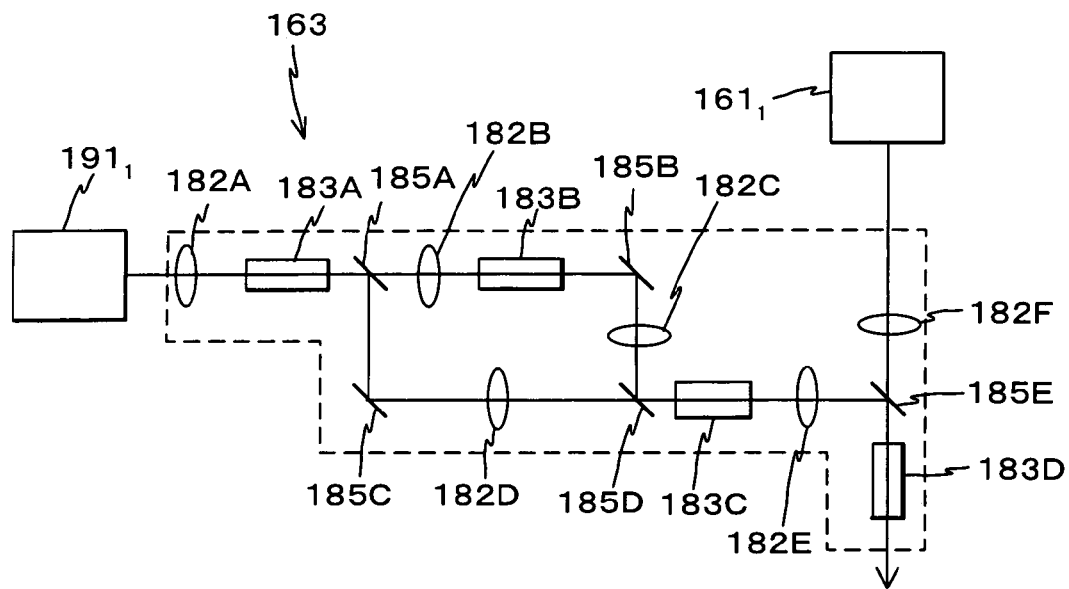
FIG. 11A is a view showing an example (No. 1) of a structure of a wavelength converter that can obtain light having a wavelength of 193.4 nm.

More specifically, as is shown in FIG. 11A, the first fundamental wave having the wavelength of 1105 nm (frequency: $\omega_1$) output from optical amplifier $191_1$ enters nonlinear optical crystal 183A of the first step via condenser lens 182A. When the first fundamental wave passes through nonlinear optical crystal 183A, the double wave having a frequency twice the frequency $\omega_1$ of the first fundamental wave, that is, frequency $2\omega_1$ (wavelength is ½ that is 552.5 nm) is generated due to the generation of secondary harmonic.

As nonlinear optical crystal 183A of the first step, the $LiB_3O_5$ (LBO) crystal is used, and the method by adjusting the temperature of the LBO crystal, which is NCPM (Non-Critical Phase Matching), is used for the phase matching to convert the fundamental wave to a double wave. The first fundamental wave that has passed through nonlinear optical crystal 183A without wavelength conversion is reflected by dichroic mirror 185A, and the double wave generated by the wavelength conversion of nonlinear optical crystal 183A passes through dichroic mirror 185A, and enters nonlinear optical crystal 183B via condenser lens 182B.

When the double wave passes through nonlinear optical crystal 183B, the fourfold wave having a frequency four times the frequency $\omega_1$ of the first fundamental wave, that is, frequency $4\omega_1$ (wavelength is ¼ that is 276.3 nm) is generated due to the generation of secondary harmonic. As nonlinear optical crystal 183B of the second step, the $CsLiB_6O_{10}$ (CLBO) crystal is used.

The first fundamental wave reflected by dichroic mirror 185A is reflected by mirror 185C, and passes through dichroic mirror 185D via condenser lens 182D. Then, the fourfold wave generated in nonlinear optical crystal 183B is reflected by mirror 185B and then reflected by dichroic mirror 185D via the condenser lens 182C, and is synthesized coaxially with the first fundamental wave and then enters nonlinear optical crystal 183C of the third step.

As nonlinear optical crystal 183C of the third step, the $CsLiB_6O_{10}$ (CLBO) crystal is used. In nonlinear optical crystal 183C, the fivefold wave (wavelength: 221.0 nm) of the first fundamental wave is obtained due to the generation of sum-frequency of the fourfold wave of the first fundamental wave and the first fundamental wave.

The fivefold wave obtained in nonlinear optical crystal 183C is reflected by the dichroic mirror 185E after passing through the condenser lens 182E, and is synthesized coaxially with the second fundamental wave having the wavelength of 1546.9 nm (frequency: $\omega_2$) output from the optical amplifier $161_1$ and having passed through condenser lens 182F. It then enters nonlinear optical crystal 183D of the fourth step. As the nonlinear optical crystal 183D of the fourth step, the $CsLiB_6O_{10}$ (CLBO) crystal is used. In nonlinear optical crystal 183D, light having the wavelength of 193.4 nm is obtained due to the generation of sum-frequency of the fivefold wave of the first fundamental wave and the second fundamental wave.

Figure 11B:
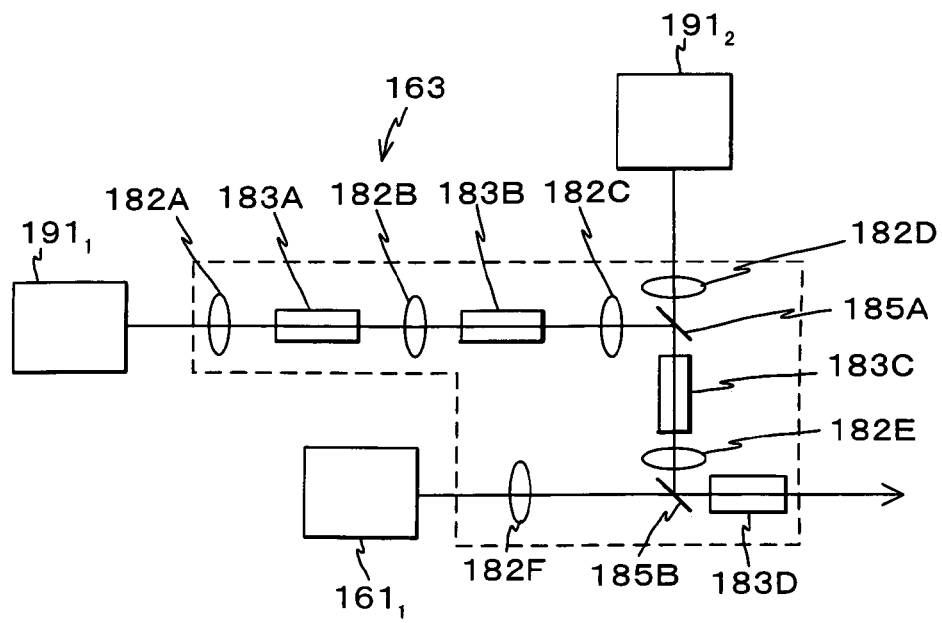
FIG. 11B is a view showing an example (No. 2) of a structure of a wavelength converter that can obtain light having a wavelength of 193.4 nm.

Furthermore, as is shown in FIG. 11B, the first fundamental wave having the wavelength of 1105 nm (frequency: $\omega_1$) output from optical amplifier $191_1$ enters nonlinear optical crystal 183A of the first step via condenser lens 182A. When the first fundamental wave passes through nonlinear optical crystal 183A, the double wave of the first fundamental wave is generated due to the generation of secondary harmonic. As nonlinear optical crystal 183A of the first step, the $LiB_3O_5$ (LBO) crystal is used, similar to wavelength converter 163 of FIG. 11A.

The double wave generated by the wavelength conversion of nonlinear optical crystal 183A enters nonlinear optical crystal 183B via condenser lens 182B. When the double wave passes through nonlinear optical crystal 183B, the fourfold wave of the frequency $\omega_1$ of the first fundamental wave is generated due to the generation of secondary harmonic. As the nonlinear optical crystal 183B of the second step, the $CsLiB_6O_{10}$ (CLBO) crystal is used.

The fourfold wave obtained in nonlinear optical crystal 183B is reflected by dichroic mirror 185A after passing through condenser lens 182C, and is synthesized coaxially with the first fundamental wave having the wavelength of 1105 nm (frequency: $\omega_1$) output from optical amplifier $191_2$ and having passed through condenser lens 182D. It then enters nonlinear optical crystal 183C of the third step. As nonlinear optical crystal 183C of the third step, the $CsLiB_6O_{10}$ (CLBO) crystal is used. In nonlinear optical crystal 183C, the fivefold wave (wavelength: 221.0 nm) of the first fundamental wave is obtained due to the generation of sum-frequency of the fourfold wave of the first fundamental wave and the first fundamental wave.

The fivefold wave obtained in nonlinear optical crystal 183C is reflected by dichroic mirror 185B after passing through condenser lens 182E, and is synthesized coaxially with the second fundamental wave having the wavelength of 1546.9 nm (frequency: $\omega_2$) output from optical amplifier $161_1$ and having passed through condenser lens 182F. It then enters nonlinear optical crystal 183D of the fourth step. As nonlinear optical crystal 183D of the fourth step, the $CsLiB_6O_{10}$ (CLBO) crystal is used. In nonlinear optical crystal 183D, the light having the wavelength of 193.4 nm is obtained due to the generation of sum-frequency of the fivefold wave of the first fundamental wave and the second fundamental wave.

Figure 12A:
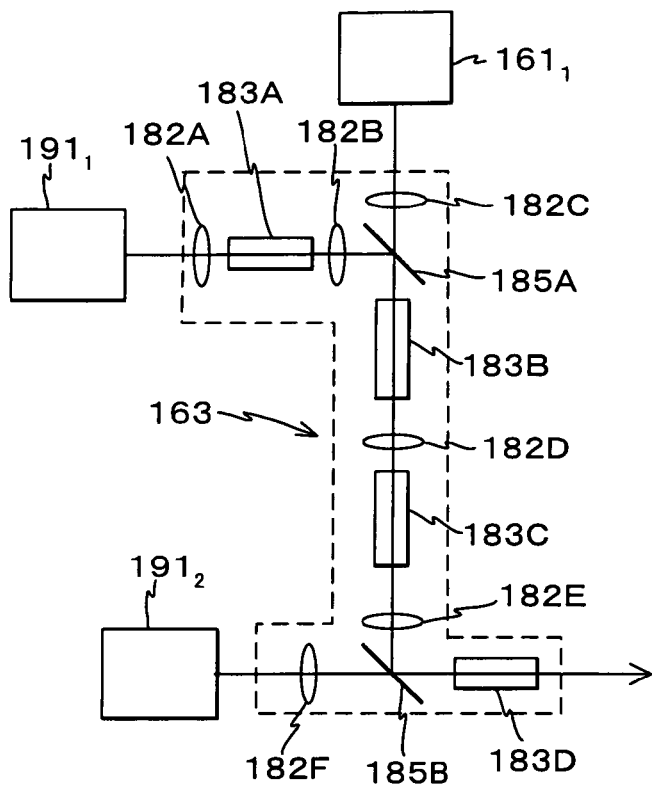
FIG. 12A is a view showing an example (No. 3) of a structure of a wavelength converter that can obtain light having a wavelength of 193.4 nm.

Further, as is shown in FIG. 12A, the first fundamental wave having the wavelength of 1105 nm (frequency: $\omega_1$) output from optical amplifier $191_1$ enters nonlinear optical crystal 183A of the first step via condenser lens 182A. When the first fundamental wave passes through nonlinear optical crystal 183A, the double wave of the frequency $\omega_1$ of the first fundamental wave, that is, frequency $2\omega_1$ (wavelength is ½ that is 552.5 nm) is generated due to the generation of secondary harmonic. As nonlinear optical crystal 183A of the first step, the $LiB_3O_5$ (LBO) crystal is used.

The double wave of the first fundamental wave obtained in nonlinear optical crystal 183A is reflected by dichroic mirror 185A after passing through condenser lens 182B, and is synthesized coaxially with the second fundamental wave having the wavelength of 1546.9 nm (frequency: $\omega_2$) output from optical amplifier $161_1$ and having passed through condenser lens 182C. It then enters nonlinear optical crystal 183B of the second step. As nonlinear optical crystal 183B of the second step, the above-described PPKTP crystal as the quasi-phase-matching crystal is used. The sum-frequency (wavelength: 407.1 nm) of the double wave of the first fundamental wave and the second fundamental wave is obtained in nonlinear optical crystal 183B by the generation of sum-frequency of the double wave of the first fundamental wave and the second fundamental wave.

The sum-frequency generated due to the wavelength conversion of nonlinear optical crystal 183B enters nonlinear optical crystal 183C via the condenser lens 182D.

When the sum-frequency passes through nonlinear optical crystal 183C, sum-frequency (wavelength: 234.4 nm) of the fourfold wave of the first fundamental wave and the second fundamental wave is generated. As nonlinear optical crystal 183C of the third step, the BBO crystal is used.

The sum-frequency of the fourfold wave of the first fundamental wave and the second fundamental wave, which has been obtained in nonlinear optical crystal 183C, is reflected by dichroic mirror 185B after passing through the condenser lens 182E, and is synthesized coaxially with the first fundamental wave having the wavelength of 1105 nm (frequency: $\omega_1$) output from optical amplifier 191$_2$ and having passed through condenser lens 182F. It then enters nonlinear optical crystal 183D of the fourth step.

As nonlinear optical crystal 183D of the fourth step, the $CsLiB_6O_{10}$ (CLBO) crystal is used. In nonlinear optical crystal 183D, the sum-frequency (wavelength: 193.4 nm) of the fivefold wave of the first fundamental wave and the second fundamental wave is obtained.

Figure 12B:
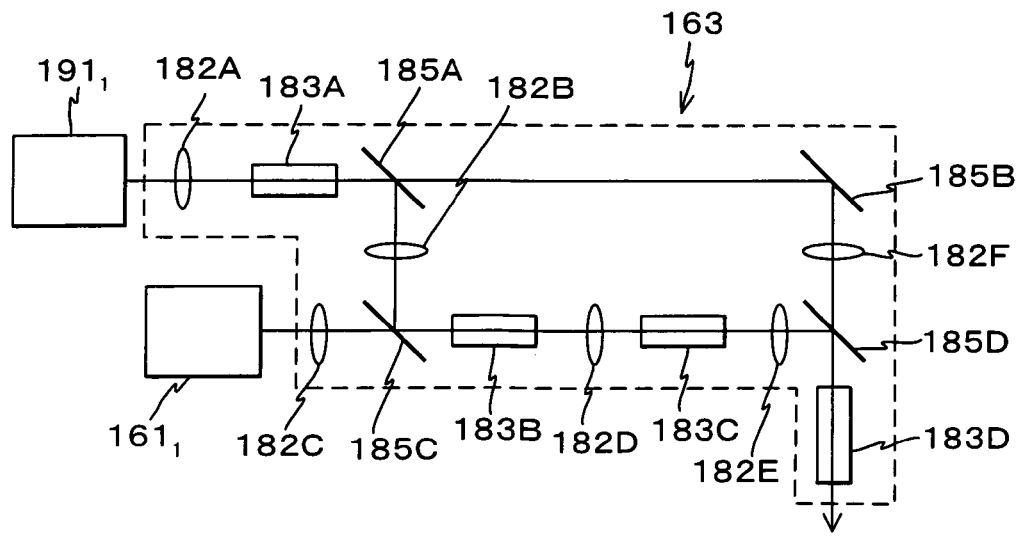
FIG. 12B is a view showing an example (No. 4) of a structure of a wavelength converter that can obtain light having a wavelength of 193.4 nm.
Figure 13:
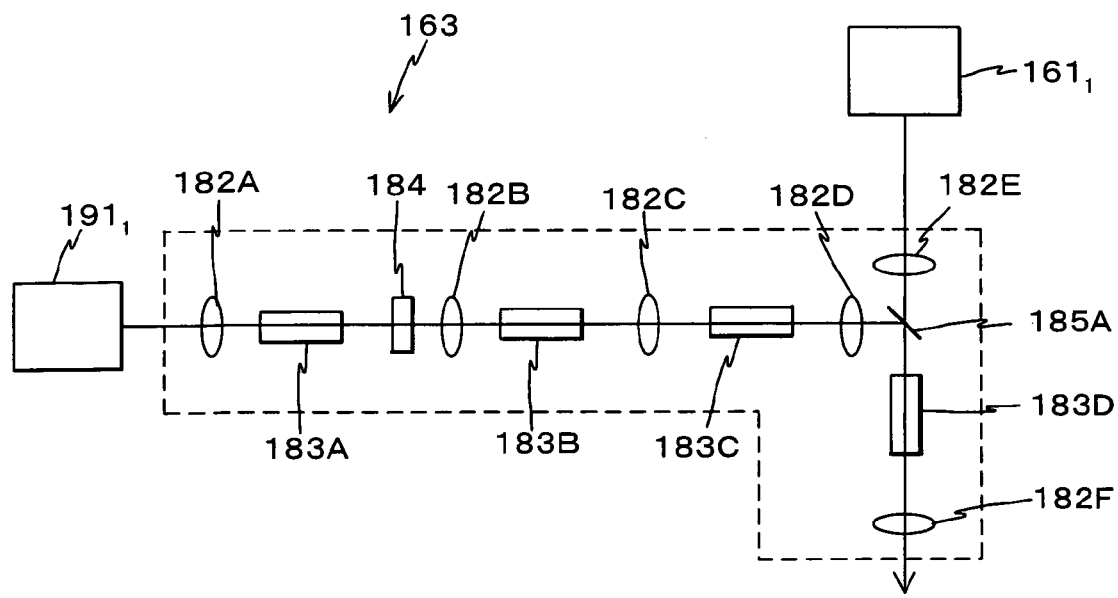
FIG. 13 is a view showing an example (No. 5) of a structure of a wavelength converter that can obtain light having a wavelength of 193.4 nm.

Furthermore, as is shown in FIG. 12B, the first fundamental wave having the wavelength of 1105 nm (frequency: $\omega_1$) output from optical amplifier 191$_1$ enters nonlinear optical crystal 183A of the first step via condenser lens 182A. When the first fundamental wave passes through nonlinear optical crystal 183A, the double wave of frequency $\omega_1$ of the first fundamental wave, that is, frequency $2\omega_1$ (wavelength is ½, that is 552.5 nm) is generated due to the generation of secondary harmonic. As nonlinear optical crystal 183A of the first step, the $LiB_3O_5$ (LBO) crystal is used.

The double wave of the first fundamental wave obtained in nonlinear optical crystal 183A is reflected by dichroic mirror 185A, and then reflected by dichroic mirror 185C after passing through condenser lens 182B, and is synthesized coaxially with the second fundamental wave having the wavelength of 1546.9 nm (frequency: $\omega_2$) from optical amplifier 161$_1$ and having passed through condenser lens 182C. Then it enters nonlinear optical crystal 183B of the second step. As nonlinear optical crystal 183B of the second step, the above-described PPKTP crystal, which is the quasi-phase-matching crystal, is used. In nonlinear optical crystal 183B, the sum-frequency (wavelength: 407.1 nm) of the double wave of the first fundamental wave and the second fundamental wave is obtained by the generation of sum-frequency of the double wave of the first fundamental wave and the second fundamental wave. The sum-frequency generated due to the wavelength conversion of the nonlinear optical crystal 183B enters nonlinear optical crystal 183C via the condenser lens 182D.

When the sum-frequency passes through nonlinear optical crystal 183C, sum-frequency (wavelength: 234.4 nm) of the fourfold wave of the first fundamental wave and the second fundamental wave is generated. As nonlinear optical crystal 183C of the third step, the BBO crystal is used.

Meanwhile, the first fundamental wave that has passed through dichroic mirror 185A without being converted by nonlinear optical crystal 183A is reflected by mirror 185B, passes through condenser lens 182F, and then enters dichroic mirror 185D. The sum-frequency of the fourfold wave of the first fundamental wave and the second fundamental wave, which has been obtained in nonlinear optical crystal 183C, is reflected by dichroic mirror 185D after passing through condenser lens 182E, and is synthesized coaxially with the first fundamental wave, and then it enters nonlinear optical crystal 183D of the fourth step. As the nonlinear optical crystal 183D of the fourth step, the $CsLiB_6O_{10}$ (CLBO) crystal is used. In nonlinear optical crystal 183D, the sum-frequency (wavelength: 193.4 nm) of the fivefold wave of the first fundamental wave and the second fundamental wave is obtained.

In wavelength converter 163 having the configuration described above, by performing wavelength conversion using the first fundamental wave (wavelength: 1105.0 nm) output from the optical amplifier 191$_1$ or the like and the second fundamental wave (wavelength: 1546.9 nm) output from the optical amplifier 161$_1$ or the like as incident lights, light having the target wavelength of 193.4 nm is obtained.

In the case an $NH_4H_2PO_4$ (ADP) crystal is used as nonlinear optical crystal 183B of the second step, because walk-off between the first fundamental wave and its secondary harmonic does not occur in nonlinear optical crystal 183B, there is no need to arrange the path shown in FIG. 11A to make the fundamental wave detour (dichroic mirror 185A→mirror 185C→condenser mirror 182D→dichroic mirror 185D). Therefore, in the case of using the $NH_4H_2PO_4$ (ADP) crystal as nonlinear optical crystal 183B of the second step, wavelength converter 163 can have the configuration shown in FIG. 13.

As is described above, in wavelength converter 163 shown in FIGS. 11A, 11B, 12A, 12B, and 13, the pulsed ultraviolet light having the same wavelength of 193.4 nm as the ArF excimer laser can be obtained by the generation of sum-frequency of the fivefold wave of the first fundamental wave (wavelength: 1105 nm) and the second fundamental wave (wavelength: 1546.9 nm), based on the four step configuration of nonlinear optical crystals (four steps of wavelength conversion). Consequently, the second embodiment has an advantage of the wavelength conversion efficiency being even higher because the number of wavelength conversion can be reduced from five steps where only light output from the erbium doped optical fiber amplifier shown in FIG. 4 or the like is used as the fundamental wave to four steps.

In wavelength converter 163 having the configuration shown in FIGS. 11A, 11B, 12A, 12B, and 13, as the second fundamental wave, light that is output from an optical fiber amplifier to which thulium (Tm) or holmium (Ho) is doped may be used instead of the light that is output from the erbium doped optical fiber amplifier. In the case the thulium (or holmium) doped optical fiber amplifier having the output wavelength of a 2 μm band is applied instead of the erbium doped optical fiber amplifier having the output wavelength of a 1.5 μm band as described above, the wavelength of light that is output from the ytterbium doped optical fiber amplifier is 1070 nm, which can make the fluorescent cross-sectional area larger than when the ytterbium doped optical fiber amplifier outputs light whose wavelength is 1105 nm, which in turn is advantageous in amplifying a high peak power.

Furthermore, in wavelength converter 163 described above, light having approximately the same wavelength (193.4 nm) as the oscillation wavelength of the ArF excimer laser can be obtained. In the second embodiment, however, it is possible to obtain approximately the same wavelength as the oscillation wavelength of a KrF excimer laser (near 248 nm) or the oscillation wavelength of an $F_2$ laser (near 157 nm) when the configuration of wavelength converter 163 is changed.

Figure 14:
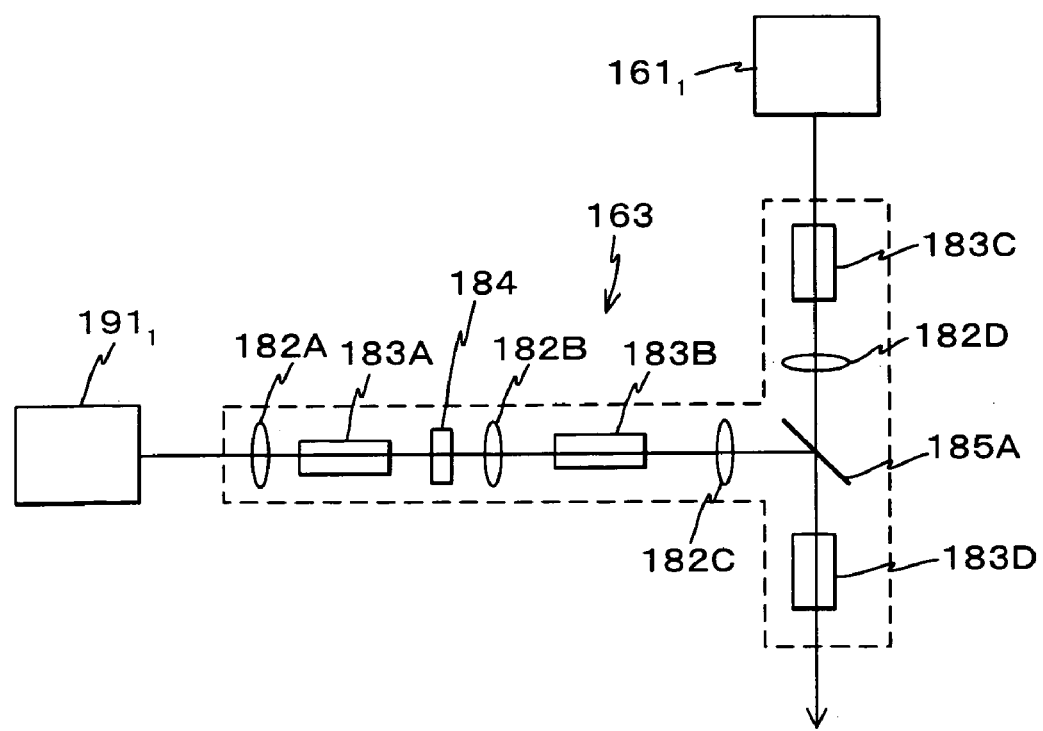
FIG. 14 is a view showing an example of a structure of the wavelength converter that can obtain light having a wavelength of 248 nm.

FIG. 14 shows the configuration of wavelength converter 163 that generates and outputs light having the wavelength of 248 nm that is approximately the same as the oscillation wavelength of the KrF excimer laser due to the generation of sum-frequency of the triple wave of the first fundamental wave (wavelength: 1095 nm) and the double wave of the second fundamental wave (wavelength: 1546.9 nm). As is shown in FIG. 14, the first fundamental wave having the wavelength of 1095 nm (frequency: $\omega_1$) output from optical amplifier 191$_1$ enters nonlinear optical crystal 183A of the first step via condenser lens 182A. When the first fundamental wave passes through nonlinear optical crystal 183A, the double wave of the frequency $\omega_1$ of the first fundamental wave, that is, frequency $2\omega_1$ (wavelength is ½ that is 547.5 nm) is generated due to the generation of secondary harmonic. As nonlinear optical crystal 183A of the first step, the LiB$_3$O$_5$ (LBO) crystal is used, and the method of adjusting the temperature of the LBO crystal, which is the NCPM (Non-Critical Phase Matching), is used for the phase matching to convert the fundamental wave into the double wave.

The first fundamental wave that has passed through nonlinear optical crystal 183A without wavelength conversion and its double wave generated due to the wavelength conversion by nonlinear optical crystal 183A are respectively given the delay of a half wavelength and one wavelength by wavelength plate 184 of the next step. Then, the polarization direction of only the first fundamental wave is rotated by 90 degrees. This allows the polarization directions of the first fundamental wave and its double wave to match. The first fundamental wave and its double wave that have passed through wavelength plate 184 enter nonlinear optical crystal 183B of the second step, after passing through the condenser lens 182B. As nonlinear optical crystal 183B of the second step, for example, an LBO crystal is used where phase matching is performed by CPM at a different temperature from that of nonlinear optical crystal (LBO crystal) 183A of the first step. In nonlinear optical crystal 183B, the triple wave (wavelength: 365.0 nm) is obtained due to the generation of sum-frequency of the double wave generated in nonlinear optical crystal 183A of the first step and the fundamental wave that has passed through nonlinear optical crystal 183A without wavelength conversion.

The second fundamental wave having the wavelength of 1546.9 nm (frequency: $\omega_2$) output from optical amplifier 161$_1$ enters nonlinear optical crystal 183C of the third step. When the second fundamental wave passes through nonlinear optical crystal 183C, the double wave of the frequency $\omega_2$ of the second fundamental wave, that is, frequency 2$\omega_2$ (wavelength is ½, that is 773.5 nm) is generated due to the generation of secondary harmonic.

The triple wave obtained in nonlinear optical crystal 183B is reflected by dichroic mirror 185A after passing through condenser lens 182C, and is synthesized coaxially with the double wave of the second fundamental wave which has been generated in nonlinear optical crystal 183C, and then it enters nonlinear optical crystal 183D of the fourth step. As nonlinear optical crystal 183D of the fourth step, the CsLiB$_6$O$_{10}$ (CLBO) crystal is used. In nonlinear optical crystal 183D, light having the wavelength of 248.0 nm is obtained due to the generation of sum-frequency of the triple wave of the first fundamental wave and the double wave of the second fundamental wave. Because there are only a few steps in the wavelength conversion in wavelength converter 163, that is, three steps, high wavelength conversion efficiency can be obtained. Further, because the wavelength converter can be structured using crystals of high durability, light having a high output level can be obtained.

Figure 15:
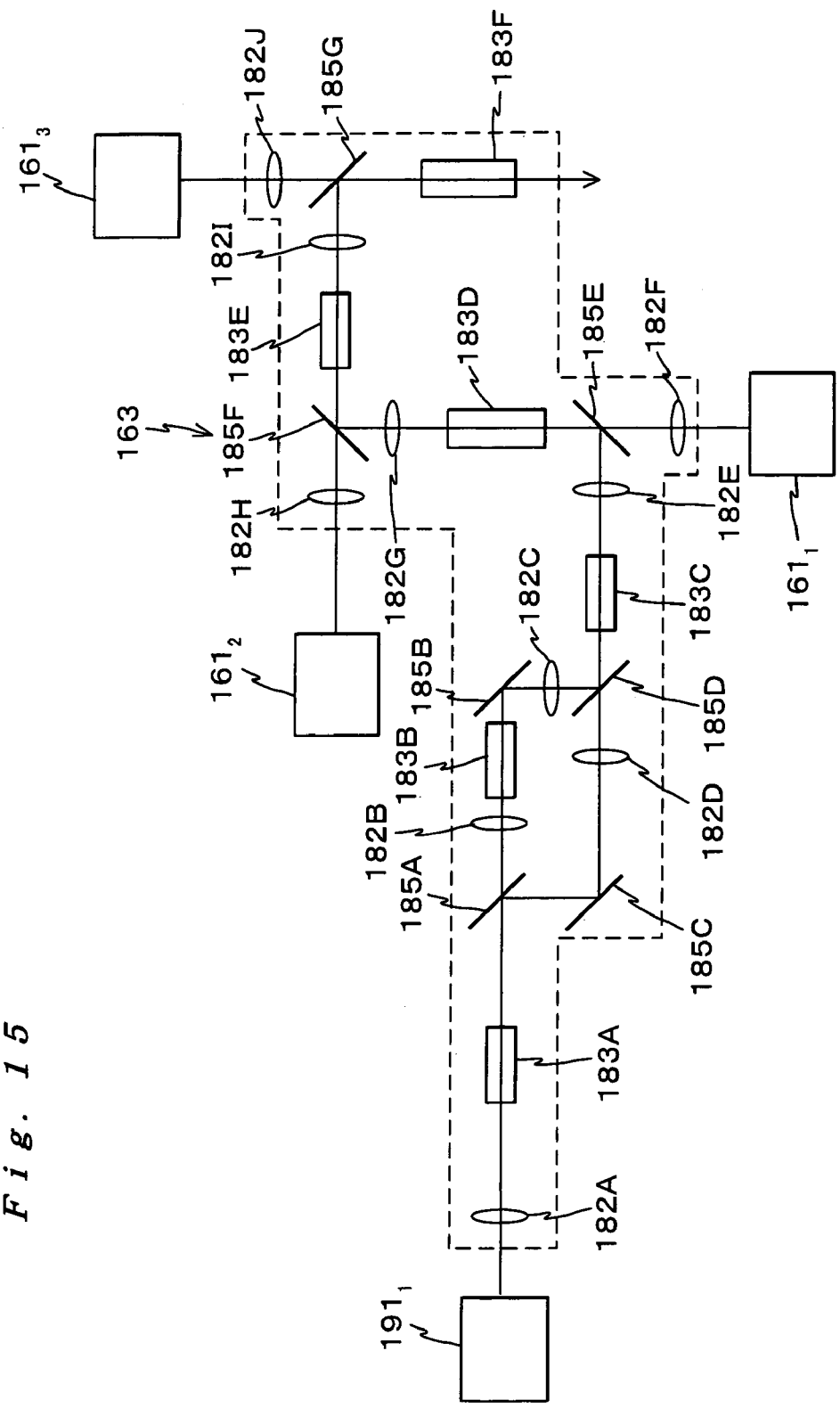
FIG. 15 is a view showing an example of a structure of a wavelength converter that can obtain light having a wavelength of 157.6 nm.

FIG. 15 shows a configuration of wavelength converter 163 that generates and outputs light having the wavelength of 157.6 nm, which is approximately the same as the oscillation wavelength of the F$_2$ laser due to the generation of sum-frequency of the fivefold wave of the first fundamental wave (wavelength: 1119 nm) and the triple wave of the second fundamental wave (wavelength: 1599 nm). As is shown in FIG. 15, the nonlinear optical crystal 183D, the configuration until the light having the wavelength of 193.4 nm is obtained due to the generation of sum-frequency of the fivefold wave of the first fundamental wave and the second fundamental wave is the same as that of wavelength converter shown in FIG. 11A. In FIG. 15, however, the wavelength of the first fundamental wave that is input from optical amplifier 191$_1$ is to be 1119 nm and the wavelength of the second fundamental wave that is input from optical amplifiers 161$_1$ to 161$_3$ is to be 1599 nm.

The sum-frequency of the fivefold wave of the first fundamental wave and the second fundamental wave generated in nonlinear optical crystal 183D is reflected by dichroic mirror 185F after passing through condenser lens 182G, and is synthesized coaxially with the second fundamental wave having the wavelength of 1599 (frequency: $\omega_2$) output from optical amplifier 161$_2$ and having passed through the condenser lens 182H. And then, it enters nonlinear optical crystal 183E of the fifth step.

As nonlinear optical crystal 183E of the fifth step, the CBO crystal is used. In nonlinear optical crystal 183E, the sum-frequency (wavelength: 174.8 nm) of the fivefold wave of the first fundamental wave and the double wave of the second fundamental wave is obtained. Instead of CBO crystal 183E, the KBBF crystal also can be used.

The sum-frequency of the fivefold wave of the first fundamental wave and the double wave of the second fundamental wave generated in nonlinear optical crystal 183E is reflected by dichroic mirror 185G after passing through the condenser lens 182I, and is synthesized coaxially with the second fundamental wave having the wavelength of 1599 nm (frequency: $\omega_2$) output from optical amplifier 161$_3$ and having passed through a condenser lens 182J. It then enters nonlinear optical crystal 183F of the sixth step. In nonlinear optical crystal 183F, the sum-frequency (wavelength: 157.6 nm) of the fivefold wave of the first fundamental wave and the triple wave of the second fundamental wave is obtained. As nonlinear optical crystal 183F, the BMF crystal described above, which is a quasi-phase-matching crystal, is used. Also in this case, because the BMF crystal uses two lights having significantly different wavelengths as incident lights, which are the second fundamental wave (1599 nm) and the sum-frequency (174.8 nm) of the fivefold wave of the first fundamental wave and the double wave of the second fundamental wave, cycle Λ of the BMF crystal can be set to about 3 μm, which makes the manufacturing of BMF crystals easier.

As is described above in detail, the light source unit of the second embodiment uses the two lights having different wavelengths (the first fundamental wave and the second fundamental wave) as incident lights, and can generate light having wavelength other than the harmonic of the wavelength of the first and second waves, so that the selection range of the wavelength of the output light can be widened. Particularly, light having approximately the same wavelength as the oscillation wavelength of the KrF excimer laser could not be generated by wavelength conversion that uses light output only from the erbium doped optical fiber amplifier or only from the ytterbium doped optical fiber amplifier as the fundamental wave. However, by the wavelength conversion using wavelength converter 163 or the like shown in FIG. 14, it became possible to generate light having such a wavelength.

In the light source unit of the second embodiment, as a light output unit outputting the first fundamental wave the ytterbium doped optical fiber amplifier was used, and as a light output unit outputting the second fundamental wave the erbium doped optical fiber amplifier was used. Ytterbium can be doped in ten times or more high concentration when compared with erbium. Accordingly, the ytterbium-doped fiber can be shorter than the erbium doped fiber. With the shorter fiber, Raman scattering and four-wave mixing are difficult to occur and high peak power can be obtained. Furthermore, the increase in spectrum width caused by SPM (self phase modulation), which occurs in the fiber, becomes small. Consequently, it is easier for the ytterbium doped optical fiber amplifier to narrowband the generated light than the erbium doped optical fiber amplifier. In addition, the ytterbium doped optical fiber amplifier is advantageous in increasing output because it behaves similarly to the four-level system laser when the wavelength of incident light is 1060 nm or more. Therefore, in the second embodiment, light having much higher output and narrower spectrum can be obtained when compared to the configuration using only the erbium doped optical fiber amplifier.

Figure 16:
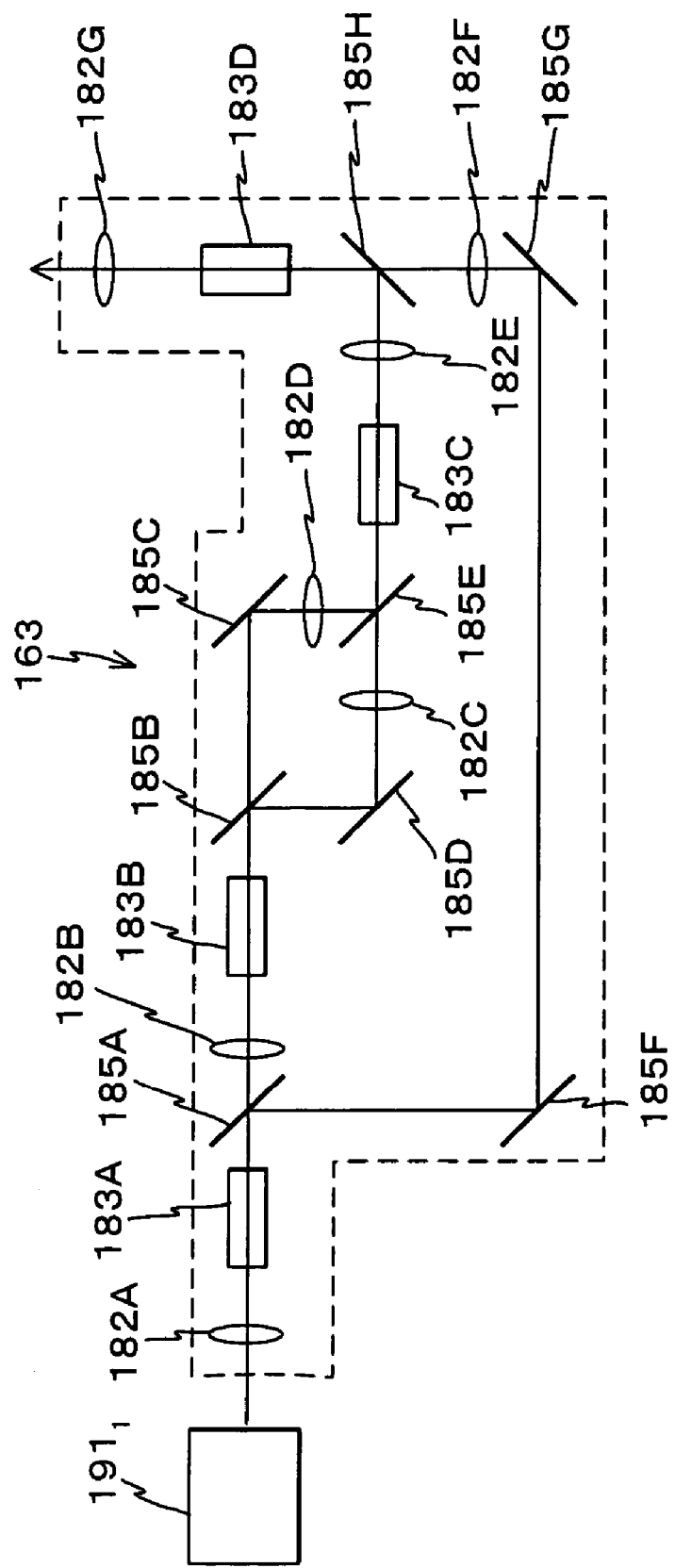
FIG. 16 is a view showing an example of a structure of a wavelength converter that can obtain light having a wavelength of 157.6 nm, using light output from a ytterbium doped optical fiber amplifier as a fundamental wave.
Figure 17:
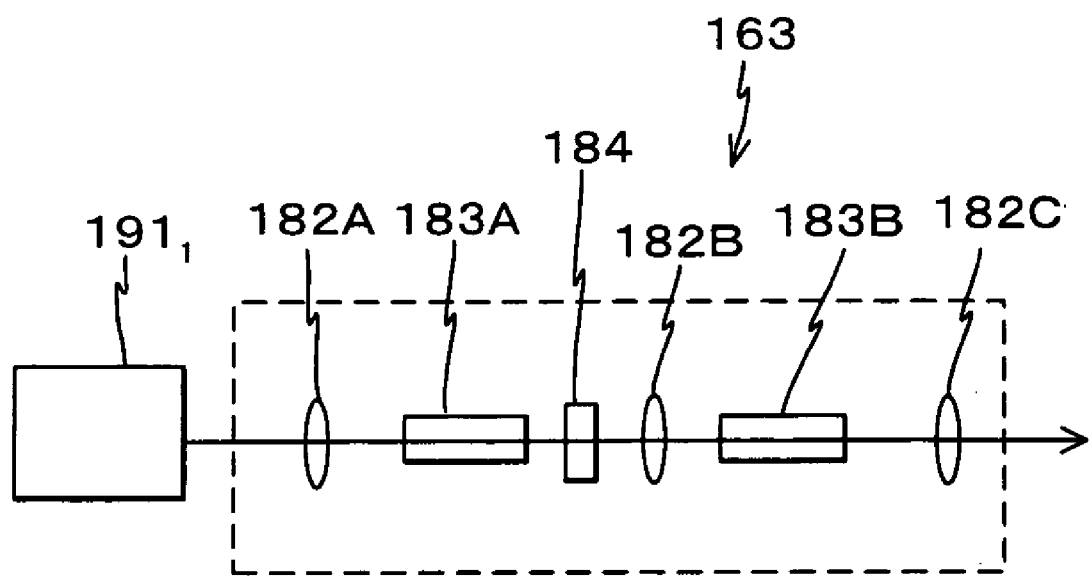
FIG. 17 is a view showing an example of a structure of a wavelength converter that can obtain light having a wavelength of 365 nm.
Figure 18:
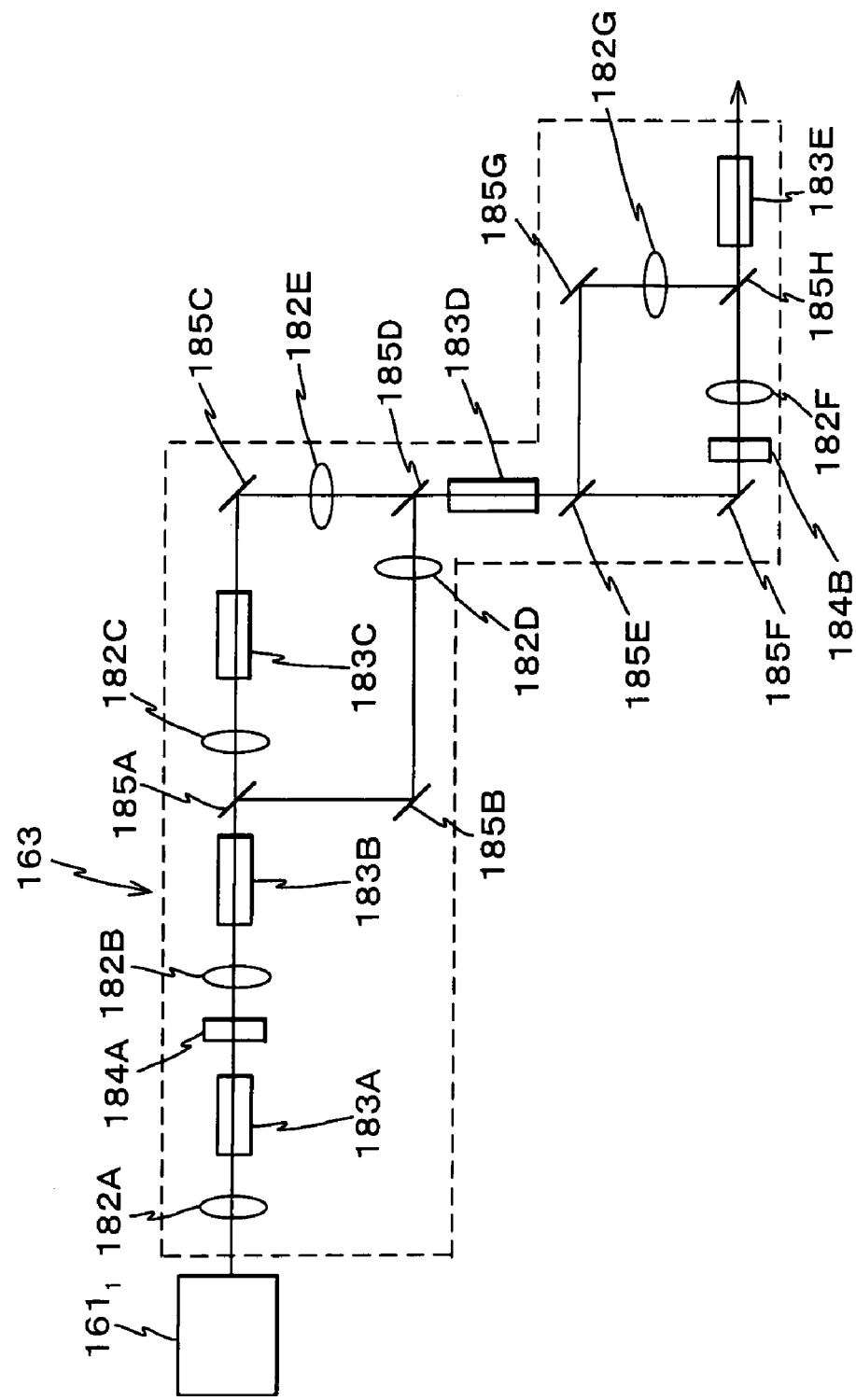
FIG. 18 is a view showing an example of a structure of a wavelength converter that can obtain light having a wavelength of 193.4 nm, using light output from an erbium doped optical fiber amplifier as a fundamental wave

FIGS. 16 to 18 show other examples of wavelength converter 163 that performs wavelength conversion using the light that has been output from the ytterbium doped optical fiber amplifier and the erbium doped optical fiber amplifier described above as the fundamental wave.

Of these examples, FIG. 16 shows the configuration of wavelength converter 163 that outputs the light having the wavelength of 157.6 nm by using light (wavelength: 1103.2 nm) output from the ytterbium doped optical fiber amplifier $191_1$ as the fundamental wave. As is shown in FIG. 16, the fundamental wave having the wavelength of 1103.2 nm (frequency: ω) output from optical amplifier $191_1$ enters nonlinear optical crystal 183A of the first step via condenser lens 182A. When the fundamental wave passes through nonlinear optical crystal 183A, the double wave of the frequency ω of the fundamental wave, that is, frequency 2ω (wavelength is ½ that is 551.6 nm) is generated due to the generation of secondary harmonic. As the nonlinear optical crystal 183A of the first step, the $LiB_3O_5$ (LBO) crystal is used, and the method of adjusting the temperature of the LBO crystal, which is the NCPM (Non-Critical Phase Matching), is used for the phase matching to convert the fundamental wave to the double wave.

The fundamental wave that has passed through nonlinear optical crystal 183A without wavelength conversion is reflected by dichroic mirror 185A, and the double wave generated due to the wavelength conversion of nonlinear optical crystal 183A passes through dichroic mirror 185A and enters nonlinear optical crystal 183B via condenser lens 182B.

When the double wave passes through nonlinear optical crystal 183B, the fourfold wave of the frequency ω of the fundamental wave, that is, frequency 4ω (wavelength is ¼ that is 275.8 nm) is generated due to the generation of secondary harmonic. As nonlinear optical crystal 183B of the second step, the $CsLiB_6O_{10}$ (CLBO) crystal or the CBO crystal is used.

The double wave that has passed through nonlinear optical crystal 183B without wavelength conversion is reflected by dichroic mirror 185B and mirror 185D, and then passes through dichroic mirror 185E via condenser lens 182C. Further, the fourfold wave generated by the wavelength conversion of nonlinear optical crystal 183B passes through the dichroic mirror 185B, and is reflected by dichroic mirror 185E after being reflected by the mirror 185C, and then is synthesized coaxially with the double wave that has passed through dichroic mirror 185E, and finally enters nonlinear optical crystal 183C. As nonlinear optical crystal 183C of the third step, the KBBF ($KBe_2BO_3F_2$: Potassium fluoroboratoberyllate) is used and the sixfold wave (wavelength: 183.9 nm) is obtained due to the sum-frequency of the double wave and the fourfold wave that have entered the crystal.

The fundamental wave that has passed through nonlinear optical crystal 183A without wavelength conversion is reflected by dichroic mirror 185A→mirror 185F→mirror 185G, passes through condenser lens 182F, and then passes through dichroic mirror 185H. The sixfold wave obtained in nonlinear optical crystal 183C is synthesized coaxially with its fundamental wave by dichroic mirror 185H after passing through the condenser lens 182E, and then it enters nonlinear optical crystal 183D.

As nonlinear optical crystal 183D of the fourth step, the $BaMgF_4$ (BMF) crystal described above is used, and the sevenfold wave (wavelength: 157.6 nm) is obtained due to the generation of sum-frequency of the fundamental wave and the sixfold wave. In this case as well, since the fundamental wave and the sixfold wave are used as incident lights, cycle Λ of the BMF crystal is set to about 2.3 μm, which makes the manufacturing of BMF crystals easier. In the case the fourfold wave and the triple wave are used as incident lights as in the conventional conversion, cycle Λ of the BMF crystal must be set to about 1 μm, which made the crystal manufacturing extremely difficult. The sevenfold wave obtained passes through condenser lens 182G and is output from wavelength converter 163.

FIG. 17 shows the configuration of wavelength converter 163 that outputs light having the wavelength of an i-line (365 nm) by using the light (wavelength: 1095 nm) output from the ytterbium doped optical fiber amplifier $191_1$ as the fundamental wave.

As is shown in FIG. 17, the fundamental wave having the wavelength of 1095 nm that has been output from optical amplifier $191_1$ enters nonlinear optical crystal 183A of the first step via condenser lens 182A. When the fundamental wave passes through nonlinear optical crystal 183A, the double wave of the frequency ω of the fundamental wave, that is, frequency 2ω (wavelength is ½ that is 547.5 nm) is generated due to the generation of secondary harmonic. As nonlinear optical crystal 183A of the first step, the $LiB_3O_5$ (LBO) crystal is used, and the method of adjusting the temperature of the LBO crystal, which is the NCPM (Non-Critical Phase Matching), is used for the phase matching to convert the fundamental wave to the double wave.

The fundamental wave that has passed through nonlinear optical crystal 183A without wavelength conversion and the double wave generated by the wavelength conversion of nonlinear optical crystal 183A are given the delay of a half-wavelength and one wavelength by wavelength plate 184 respectively in the next step. Then, only the polarization direction of the fundamental wave is rotated by 90 degrees. This allows the polarization directions of the fundamental wave and the double wave to match. The fundamental wave and the double wave, which have passed through wavelength plate 184 enter nonlinear optical crystal 183B of the second step after passing through condenser lens 182B. As nonlinear optical crystal 183B of the second step, for example, the LBO crystal or the CBO crystal is used. In nonlinear optical crystal 183B, the triple wave (wavelength: 365.0 nm) is obtained due to the generation of sum-frequency of the double wave generated in nonlinear optical crystal 183A of the first step and the fundamental wave that passed through nonlinear optical crystal 183A without wavelength conversion. Then, the triple wave of high output and narrow spectral width is output via condenser lens 182C.

FIG. 18 shows the configuration of wavelength converter 163 that outputs light having the wavelength of 193.4 nm by using the light (wavelength: 1546.9 nm) output from the erbium doped optical fiber amplifier $161_1$ as the fundamental wave.

As is shown in FIG. 18, the fundamental wave having the wavelength of 1546.9 nm (frequency ω) output from optical amplifier $161_1$ enters nonlinear optical crystal 183A of the first step via condenser lens 182A. When the fundamental wave passes through nonlinear optical crystal 183A, the double wave of frequency ω of the fundamental wave, that is, frequency 2ω (wavelength is ½ that is 773.5 nm) is generated due to the generation of secondary harmonic. As nonlinear optical crystal 183A of the first step, the $LiB_3O_5$ (LBO) crystal is used, and the method of adjusting the temperature of the LBO crystal, which is the NCPM (Non-Critical Phase Matching), is used for the phase matching to convert the fundamental wave to the double wave.

The fundamental wave that has passed through nonlinear optical crystal 183A without wavelength conversion and the double wave generated by the wavelength conversion of nonlinear optical crystal 183A are given the delay of a half-wavelength and one wavelength by a wavelength plate 184A respectively in the next step. Then, only the polarization direction of the fundamental wave is rotated by 90 degrees. This allows the polarization directions of the fundamental wave and the double wave to match. The fundamental wave and the double wave that have passed through wavelength plate 184A enter nonlinear optical crystal 183B of the second step after passing through condenser lens 182B. As nonlinear optical crystal 183B of the second step, for example, the LBO crystal is used, and phase matching is performed to the LBO crystal using NCPM at a different temperature from nonlinear optical crystal (LBO crystal) 183A of the first step. In nonlinear optical crystal 183B, the triple wave (wavelength: 515.6 nm) is obtained, due to the generation of sum-frequency of the double wave generated in nonlinear optical crystal 183A of the first step and the fundamental wave that passed through nonlinear optical crystal 183A without wavelength conversion.

Next, the third wave obtained in nonlinear optical crystal 183B enters nonlinear optical crystal 183C of the third step via dichroic mirror 185A and condenser lens 183C. Then, when the triple wave passes through nonlinear optical crystal 183C of the third step, the sixfold wave having a frequency six times the frequency ω of the fundamental wave, that is, frequency 6ω (wavelength is ⅙ that is 257.8 nm) is generated due to the generation of secondary harmonic of the triple wave. As nonlinear optical crystal 183C of the third step, for example, the β-$BaB_2O_4$ (BBO) crystal or the $CsLiB_6O_{10}$ (CLBO) crystal is used.

The sixfold wave obtained in nonlinear optical crystal 183C is reflected by mirror 185C and passes through condenser lens 182E. Then, the sixfold wave is synthesized coaxially at dichroic mirror 185D with the fundamental wave, which has detoured from dichroic mirror 185A→mirror 185B→condenser lens 182D, and then it enters nonlinear optical crystal 183D of the fourth step. As nonlinear optical crystal 183D of the fourth step, the $CsB_3O_5$ (CBO) crystal is used.

The sevenfold wave obtained in nonlinear optical crystal 183D and the fundamental wave that has passed through the crystal are separated by dichroic mirror 185E. The fundamental wave that has passed through the crystal is reflected by mirror 185F, and then passes through the dichroic mirror 185H, after passing through a wavelength plate 184B and condenser lens 182F. Then, the sevenfold wave reflected by dichroic mirror 185E is reflected by mirror 185G, and then reflected by dichroic mirror 185H after passing through condenser lens 185G. Then, the fundamental wave and the sevenfold wave are synthesized coaxially by dichroic mirror H, and then it enters nonlinear optical crystal 183E of the fifth step. For shaping the beam of the sevenfold wave, a pair of cylindrical lens can be used, instead of condenser lens 182G.

As nonlinear optical crystal 183E of the fifth step, the $CsLiB6O_{10}$ (CLBO) crystal is used, and the eightfold wave (wavelength: 193.4 nm) is obtained by the generation of sum-frequency of the fundamental wave and the sevenfold wave.

In each of the above-described embodiments, because lights output from a plurality of optical amplifiers $161_1$, $191_1$ or the like are used as the fundamental wave, the timing of the lights needs to be adjusted. For this reason, between at least a part of the optical amplifiers and wavelength converter 163, a delay unit may be inserted that delays the progress of light input from the units to wavelength converter 163 by a predetermined period of time. Alternatively, for example, laser light source 160A and laser light source 190A of FIG. 10 may be designed to adjust the timing of each fundamental wave to be input to wavelength converter 163.

Furthermore, laser light sources 160A and 190A are structured as a continuous light source in each of the embodiments above, however, they may be pulsed light sources or made to perform pulse oscillation. In such a case, there is no need to arrange EOMs 160C and 190C between optical isolators 160B and 190B and optical amplifiers $161_1$ and $191_1$, or the EOMs 160C and 190C may be used in combination to generate pulsed light having narrow pulse width.

In addition, although the DFB laser was used as the laser light sources 160A, 190A in each of the embodiments above, however, the present invention is not limited to this and other semiconductor lasers can be used. For example, a semiconductor laser that has an external resonator configuration can be used, another semiconductor laser such as a distributed Bragg reflector (DBR) laser that does not have the external resonator configuration, or alternatively, a titanium sapphire laser or a fiber laser such as the ytterbium doped fiber laser can be used.

Further, in each of the embodiments above, the wavelength of light that is output from the wavelength converter was set to a specific wavelength such as the oscillation wavelength of the ArF excimer laser and the KrF excimer laser, and the wavelength of i-line. However, the present invention is not limited to this, and light having any wavelength from 90 nm to 800 nm can be output by changing the setting of nonlinear optical crystals or the like and the setting of the wavelength of the light that enters wavelength converter 163. As an example, the predetermined wavelength may be determined corresponding to the design rules (line width, pitch, and the like) of the pattern that is to be transferred onto wafer W.

Further, in each of the embodiments above, the case has been described where light output units that output the fundamental wave to wavelength converter 163 are all optical fiber amplifiers. However, the present invention is not limited to this, and they may be laser light sources such as an Nd:YAG laser as long as they can output light having the desired wavelength.

Additionally, the number of optical fiber amplifiers 167 arranged in parallel in optical amplifier $161_1$ shown in FIG. 3 may be any number, and such number should be determined corresponding to the specifications required in a product to which the light source unit related to the present invention is applied. Particularly, in the case high output is not required in the light source unit, the number of optical fiber amplifiers 167 may be reduced to simplify the configuration. When the configuration is simplified so that optical amplifier $161_1$ does not branch light and includes only one optical fiber amplifier 167, optical branching device 166 can also be removed. In each of the embodiments described above, optical fiber amplifier 167 was used as the optical amplifier, but a semiconductor optical amplifier can be also used. The same applies to optical amplifier $191_1$ of FIG. 10.

Further, in each of the embodiments above, the CLBO crystal, the BBO crystal or the like was used as the nonlinear optical crystal in wavelength converter 163. If deliquescency of the CLBO crystal and the BBO crystal becomes a problem, ambient atmosphere should be purged with nitrogen or dry air, or the temperature of the CLBO crystal and the BBO crystal should be adjusted to high temperature.

Furthermore, in each of the embodiments above, the case has been described where the light source unit related to the present invention was applied to the scanning exposure apparatus based on a step-and-scan method, however, the light source unit related to the present invention can also be applied to an apparatus other than an exposure apparatus such as an apparatus used in a device manufacturing process, like a laser repair unit used for cutting a part of a circuit pattern (such as fuse) formed on a wafer, an inspection unit that inspects the pattern of a reticle (mask) or a circuit pattern formed on a wafer, an overlay measurement system, or the like. In addition, the present invention can also be applied not only to the scanning exposure apparatus by the step-and-scan method, but also to a static exposure type exposure apparatus by a step-and-repeat method or a step-and-stitch method, an exposure apparatus by a proximity method, a mirror projection aligner, an immersion type exposure apparatus in which liquid (pure water, for example) is filled between a projection optical system PL and a wafer, whose details are disclosed in International Publication No.WO99/49504 pamphlet or the like. The exposure apparatus of each of the embodiments described above may be a twin wafer stage type disclosed in, for example, Japanese Patent Application Laid-open No.10-214783 and its corresponding U.S. Pat. No. 6,341,007, International Publication No.WO98/40791 pamphlet and its corresponding U.S. Pat. No. 6,262,796 or the like, in which wafer stages are severally arranged at an exposure position where a reticle pattern is transferred via a projection optical system and a measurement position (an alignment position) where mark detection by a wafer alignment system is performed, and an exposure operation and a measurement operation can be performed substantially in parallel. The disclosures cited in the above publications and U.S. patents are fully incorporated herein by reference.

In addition, in each of the embodiments above, the case has been described where the light source unit related to the present invention was used as a light source unit that generates illumination light for exposure, however, it can be also used as the light source unit for reticle alignment, which requires light having substantially the same wavelength as the illumination light for exposure, a light source unit of an aerial image detection system, which detects the projected image of marks arranged on the object plane or the image plane of a projection optical system and calculates the optical characteristics of the projection optical system, or the like.

The light source unit of the present invention can be used in various units other than the exposure apparatus. For example, the unit can be used as a light source unit used in a laser treatment unit for treating nearsightedness, astigmatism, or the like, which is performed by irradiating a laser beam on the cornea to perform ablation of its layer (or ablation of incised inner cornea) and correcting the curvature or the unevenness of the cornea. In addition, the light source unit of the present invention also can be used as a light source unit in an optical inspection unit or the like.

Furthermore, the light source unit of the present invention also can be used for optical adjustment (optical axis alignment) or inspection of any optical system such as, for example, the projection optical system, the illumination optical system and the reticle alignment system, in the exposure apparatus of the embodiments described above. Moreover, in various apparatus having the excimer laser as a light source, the light source unit of the present invention can be applied instead of the excimer laser.

The exposure apparatus that uses the light source unit in each of the embodiments described above as the light source for inspection or adjustment can be built by incorporating the illumination optical system made of a plurality of lenses and the projection optical system into the main body of the exposure apparatus and performing optical adjustment, while installing the reticle stage and the wafer stage that are made up of various mechanical components into the main body of the exposure apparatus, connecting wiring and piping, and performing total adjustment (such as electrical adjustment and operational check). The exposure apparatus is preferably made in a clean room where temperature, degree of cleanness, and the like are controlled.

The configuration of light source unit 16 shown in FIG. 2 is on the premise that it is used in exposure apparatus 10 of FIG. 1, however, light source unit 16 is not limited to the configuration shown in FIG. 2. Although the exposure apparatus requires highly accurate wavelength control, light quantity control or the like, when strict light quantity control or the like is not necessary in apparatus other than the exposure apparatus, there is no need to provide a light quantity monitor and light quantity controller 16C.

Next, a device manufacturing method (devices such as a semiconductor chip line an IC and an LSI, a liquid crystal panel, a CCD, a thin film magnetic head, a micromachine, and the like) is described that uses the exposure apparatus and the exposure method of the first and second embodiments.

Firstly, the function design of a device (for example, designing a circuit for a semiconductor device) is performed in a design step, and then, pattern design to implement such function is performed. Then, a mask on which the designed circuit pattern is formed is manufactured in a mask manufacturing step. On the other hand, a wafer is manufactured using a material such as silicon in a wafer manufacturing step.

Next, in a wafer processing step, the actual circuit or the like is formed on the wafer by lithography art or the like in a manner which will be described later on, using the mask and wafer prepared in the steps above.

The wafer processing step, on manufacturing the semiconductor device, for example, has a preprocessing which contains each step of the wafer process such as an oxidation step for oxidizing the surface of a wafer, a CVD step where an insulating film is formed on the surface of the wafer, an electrode forming step where electrodes are formed on the wafer by deposition, and an ion implantation step of implanting ions into the wafer, and a postprocessing that will be described later. The preprocessing is selected and performed according to the processing required in each step of the wafer process.

When the preprocessing is completed in each step of the wafer process, a photosensitive agent is coated on the wafer in a resist processing step, and subsequently, the circuit pattern of the mask is exposed onto the wafer by exposure apparatus 10 described above in an exposure step. Next, the exposed wafer is developed in a development step, and subsequently, in an etching step, exposed members in areas other than the area where the resist is left is removed by etching. Then, in a resist removing step, the resist that is no longer required after the etching is completed is removed.

As is described above, by repeatedly performing such preprocess and post-process, which is from the resist processing step to the resist removing step, multiple circuit patterns are formed on the wafer.

When the wafer processing step is completed in this manner, the wafer that has been processed in the wafer processing step is assembled into a chip in an assembly step. This assembly step includes processes such as an assembly process (dicing and bonding) and a packaging process (chip encapsulation).

Finally, in an inspection step, tests such as an operation confirmation test and a durability test are performed on the devices manufactured in the assembly step. The devices are completed after going through these processes, and then they are shipped out.

As is described above, the devices on which fine patterns are formed with good accuracy are manufactured with high mass productivity.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. A light source unit that generates light having a predetermined wavelength, said unit comprising:
   a plurality of light output units that output lights having wavelengths different from said predetermined wavelength; and
   a wavelength converter that generates light having said predetermined wavelength by wavelength conversion in a plurality of steps which include wavelength conversion using two lights as incident lights whose fundamental waves are severally output from different light output units of said plurality of light output units, wherein
   at least one unit of said plurality of light output units is a first unit that outputs light of a first wavelength, and at least one unit of said plurality of light output units is a second unit that outputs light of a second wavelength different from light of said first wavelength,
   wavelength conversion of said wavelength converter includes wavelength conversion in which the m-fold wave (m: natural number) of said light having the first wavelength output from said first unit and the n-fold wave (n: natural number) of said light having the second wavelength output from said second unit enter said converter to generate a sum-frequency of said m-fold wave and said n-fold wave,
   one unit of said first unit and said second unit is in plurals, and
   said wavelength conversion of said wavelength converter further includes wavelength conversion that generates a sum-frequency of said generated sum-frequency and light output from the other said one unit, which is not used for generating said sum-frequency.

2. The light source unit according to claim 1, wherein at least one unit of said plurality of light output units is an optical fiber amplifier.

3. The light source unit according to claim 1, wherein at least one unit of said plurality of light output units is an erbium doped optical fiber amplifier.

4. The light source unit according to claim 1, wherein at least one unit of said plurality of light output units is an ytterbium doped optical fiber amplifier.

5. The light source unit according to claim 1, wherein the wavelength of light input to said ytterbium doped optical fiber amplifier is longer than 1060 nm.

6. The light source unit according to claim 1, wherein said wavelength converter generates light having a wavelength near 248 nm, which is approximately the same wavelength as the oscillation wavelength of a KrF excimer laser.

7. The light source unit according to claim 1, wherein said wavelength converter generates light having a wavelength near 193 nm, which is approximately the same wavelength as the oscillation wavelength of an ArF excimer laser.

8. The light source unit according to claim 1, wherein said wavelength converter generates light having a wavelength near 157 nm, which is approximately the same wavelength as the oscillation wavelength of an $F_2$ laser.

9. The light source unit according to claim 1, wherein said wavelength converter performs wavelength conversion by using a plurality of nonlinear optical elements.

10. The light source unit according to claim 9, wherein at least one nonlinear optical element of said plurality of nonlinear optical elements is an $NH_4H_2PO_4$ crystal.

11. The light source unit according to claim 9, wherein at least one nonlinear optical element of said plurality of nonlinear optical elements is a quasi-phase-matching crystal.

12. The light source unit according to claim 11, wherein at least one of a $KTiOPO_4$ crystal and an $LiNbO_3$ crystal is used as said quasi-phase-matching crystal.

13. The light source unit according to claim 11, wherein a $BaMgF_4$ crystal is used as said quasi-phase-matching crystal.

14. The light source unit according to claim 13, wherein said $BaMgF_4$ crystal generates the sum-frequency of said fundamental wave and an m-fold wave (m: natural number) of said fundamental wave.

15. The light source unit according to claim 1, wherein a delay unit delays light propagation input from said units to said wavelength converter by a predetermined period of time.

16. The light source unit according to claim 15, wherein said delay unit is inserted in between at least some units of said each light output unit and said wavelength converter.

17. The light source unit according to claim 1, wherein said predetermined wavelength is 90 nm and over, up until 800 nm.

18. A light irradiation unit that irradiates light on an irradiation object, said unit comprising:
   the light source unit of claim 1; and
   an irradiation optical system that emits light emitted from said light source unit toward said irradiation object.

19. The light irradiation unit according to claim 18, wherein said irradiation object is a photosensitive object.

20. A light source unit that generates light having a predetermined wavelength, said unit comprising:
   a plurality of light output units that output lights having wavelengths different from said predetermined wavelength; and
   a wavelength converter that generates light having said predetermined wavelength by wavelength conversion in a plurality of steps which include wavelength conversion using two lights as incident lights whose fundamental waves are severally output from different light output units of said plurality of light output units, wherein
   at least one unit of said plurality of light output units is a first unit that outputs light of a first wavelength, and at least one unit of said plurality of light output units is a second unit that outputs light of a second wavelength different from light of said first wavelength, and
   said first unit is an ytterbium doped optical fiber amplifier, and said second unit is at least one of an erbium doped optical fiber amplifier, a thulium doped optical fiber amplifier and a holmium doped optical fiber amplifier.

* * * * *